(12) United States Patent
Lee et al.

(10) Patent No.: US 12,382,776 B2
(45) Date of Patent: Aug. 5, 2025

(54) DISPLAY DEVICE

(71) Applicant: SAMSUNG DISPLAY CO., LTD., Yongin-si (KR)

(72) Inventors: Dae-Young Lee, Seoul (KR); Sangwoo Kim, Seoul (KR); Hyeonsik Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 126 days.

(21) Appl. No.: 18/176,447

(22) Filed: Feb. 28, 2023

(65) Prior Publication Data
US 2023/0320111 A1 Oct. 5, 2023

(30) Foreign Application Priority Data
Apr. 1, 2022 (KR) .................. 10-2022-0041283

(51) Int. Cl.
*H10K 39/38* (2023.01)
*G06V 40/13* (2022.01)
(Continued)

(52) U.S. Cl.
CPC ......... *H10K 39/38* (2023.02); *G06V 40/1318* (2022.01); *G09G 3/3233* (2013.01);
(Continued)

(58) Field of Classification Search
CPC ............. G06V 40/1318; G09G 3/3233; G09G 2300/0408; G09G 2300/0452; G09G 2300/0819; G09G 2300/0842; G09G 2310/0202; G09G 2330/021; G09G 2360/14; H10K 39/34; H10K 39/38; H10K 59/1213; H10K 59/131; H10K 59/352; H10K 59/353; H10K 59/38
See application file for complete search history.

(56) References Cited

U.S. PATENT DOCUMENTS

| 8,466,892 B2 * | 6/2013 | Jung ................... G06F 3/0412 345/173 |
| 8,823,673 B2 * | 9/2014 | Jung ................... G06F 3/0412 345/173 |

(Continued)

FOREIGN PATENT DOCUMENTS

| KR | 10-2021-0064483 | 6/2021 |
| KR | 10-2021-0082685 | 7/2021 |

(Continued)

*Primary Examiner* — Michael Pervan
(74) *Attorney, Agent, or Firm* — F. CHAU & ASSOCIATES, LLC

(57) ABSTRACT

A display device includes a first pixel that includes a first pixel driving circuit and a first light emitting element, a second pixel that includes a second pixel driving circuit and a second light emitting element, a sensor that includes a sensor driving circuit and a light detection element, a first data line that extends in a first direction and is electrically connected to the first pixel, a second data line that extends in the first direction and is electrically connected to the second pixel, and a readout line that extends in the first direction and is electrically connected to the sensor. The readout line is disposed on a different layer from at least one of the first data line and the second data line.

20 Claims, 22 Drawing Sheets

(51) Int. Cl.
*G09G 3/3233* (2016.01)
*H10K 39/34* (2023.01)
*H10K 59/121* (2023.01)
*H10K 59/131* (2023.01)
*H10K 59/35* (2023.01)
*H10K 59/38* (2023.01)

(52) U.S. Cl.
CPC ......... *H10K 39/34* (2023.02); *H10K 59/1213* (2023.02); *H10K 59/131* (2023.02); *G09G 2300/0408* (2013.01); *G09G 2300/0452* (2013.01); *G09G 2300/0819* (2013.01); *G09G 2300/0842* (2013.01); *G09G 2310/0202* (2013.01); *G09G 2330/021* (2013.01); *G09G 2360/14* (2013.01); *H10K 59/352* (2023.02); *H10K 59/353* (2023.02); *H10K 59/38* (2023.02)

(56) References Cited

U.S. PATENT DOCUMENTS

| | | | | |
|---|---|---|---|---|
| 9,029,971 B2 * | 5/2015 | Jeong | .................... | H01L 33/005 |
| | | | | 257/440 |
| 9,081,435 B2 * | 7/2015 | Kim | ..................... | G06F 3/0412 |
| 9,134,837 B2 * | 9/2015 | Kim | ..................... | G06F 3/042 |
| 10,345,942 B2 * | 7/2019 | Cho | ...................... | H10K 59/13 |
| 10,380,404 B2 * | 8/2019 | Kim | .................. | G06V 40/1318 |
| 10,528,171 B2 * | 1/2020 | Cho | ..................... | G06F 3/0412 |
| 11,158,258 B2 | 10/2021 | Cha et al. | | |
| 11,308,837 B2 * | 4/2022 | Ban | ........................ | G09G 3/20 |
| 11,705,040 B2 * | 7/2023 | Ban | ..................... | G09G 3/3291 |
| | | | | 345/208 |
| 12,067,918 B2 * | 8/2024 | Ban | ..................... | G09G 3/3291 |
| 12,133,443 B2 * | 10/2024 | Kim | ..................... | H10K 59/122 |
| 2012/0032911 A1 * | 2/2012 | Jung | ....................... | G06F 3/042 |
| | | | | 345/174 |
| 2012/0262384 A1 * | 10/2012 | Kim | .................... | G06F 3/04184 |
| | | | | 345/173 |
| 2012/0268356 A1 * | 10/2012 | Kim | ..................... | G06F 3/0412 |
| | | | | 345/55 |
| 2013/0075763 A1 * | 3/2013 | Jeong | ................... | G06F 3/0412 |
| | | | | 438/22 |
| 2013/0271424 A1 * | 10/2013 | Jung | ...................... | G06F 3/042 |
| | | | | 345/174 |
| 2018/0060641 A1 * | 3/2018 | Kim | ................... | G06V 40/1335 |
| 2018/0173349 A1 * | 6/2018 | Cho | ...................... | H10K 77/111 |
| 2019/0302946 A1 * | 10/2019 | Cho | ....................... | H10K 59/40 |
| 2021/0090482 A1 * | 3/2021 | Ban | ..................... | G09G 3/3233 |
| 2021/0200366 A1 | 7/2021 | Bok et al. | | |
| 2022/0173174 A1 | 6/2022 | Hatsumi et al. | | |
| 2022/0223088 A1 * | 7/2022 | Ban | ..................... | G09G 3/3291 |
| 2022/0285460 A1 * | 9/2022 | Kim | ..................... | H10K 50/865 |
| 2023/0306887 A1 * | 9/2023 | Ban | .......................... | G09G 3/20 |

FOREIGN PATENT DOCUMENTS

| | | |
|---|---|---|
| KR | 10-2021-0086907 | 7/2021 |
| WO | WO 2020/165686 | 8/2020 |

* cited by examiner

DISPLAY DEVICE

CROSS-REFERENCE TO RELATED APPLICATIONS

This U.S. non-provisional patent application claims priority under 35 U.S.C. § 119 from Korean Patent Application No. 10-2022-0041283, filed on Apr. 1, 2022 in the Korean Intellectual Property Office, the contents of which are herein incorporated by reference in their entirety.

TECHNICAL FIELD

Embodiments of the present disclosure are directed to a display device capable of biometric information recognition.

DISCUSSION OF THE RELATED ART

A display device provides various functions that enable organic communication with users, such as providing information to users by displaying an image or sensing a user's input. Recent display devices can detect a user's biometric information. Methods of detecting biometric information recognition include a capacitive method that detects a change in capacitance formed between electrodes, an optical method that detects incident light using an optical sensor, and an ultrasonic method that senses vibration using a piezoelectric material.

SUMMARY

Embodiments of the present disclosure provide a display device with increased sensing performance of a sensor for biometric information recognition.

An embodiment of the inventive concept provides a display device that includes: a first pixel that includes a first pixel driving circuit and a first light emitting element; a second pixel that includes a second pixel driving circuit and a second light emitting element; a sensor that includes a sensor driving circuit and a light detection element; a first data line that extends in a first direction and is electrically connected to the first pixel; a second data line that extends in the first direction and is electrically connected to the second pixel; and a readout line that extends in the first direction and is electrically connected to the sensor. The readout line is disposed on a different layer from at least one of the first data line and the second data line.

In an embodiment, the first pixel driving circuit, the sensor driving circuit, and the second pixel driving circuit may be arranged in a second direction that crosses the first direction.

In an embodiment, the first data line and the second data line may be disposed on the same layer, and the readout line may be disposed on a different layer from the first data line and the second data line.

In an embodiment, the first data line and the readout line may be disposed on the same layer, and the second data line may be disposed on a different layer from the first data line and the readout line.

In an embodiment, when viewed in a plan view, the readout line may be disposed between the first data line and the second data line.

In an embodiment, when viewed in a plan view, a distance between the first data line and the readout line may be greater than a distance between the second data line and the readout line.

In an embodiment, when viewed in a plan view, a distance between the first data line and the readout line may be equal to a distance between the second data line and the readout line may be the same.

In an embodiment, the display device may further include an organic layer disposed between the second data line and the readout line.

In an embodiment, the first pixel is a green pixel, and the second pixel may be a blue pixel or a red pixel.

In an embodiment, the sensor driving circuit may include: a reset transistor that includes a first electrode that receives a reset voltage, a second electrode connected to a first sensing node, and a third electrode that receives a reset control signal; an amplification transistor that includes a first electrode that receives a sensing driving voltage, a second electrode connected to a second sensing node, and a third electrode connected to the first sensing node; and an output transistor that includes a first electrode connected to the second sensing node, a second electrode connected to the readout line, and a third electrode that receives an output control signal.

In an embodiment, the reset transistor may be an oxide semiconductor transistor.

In an embodiment, the first pixel driving circuit may include: a first transistor connected between a first driving voltage line that receives a first driving voltage and the first light emitting element; a second transistor connected between the first data line and a first electrode of the first transistor; a third transistor connected between a second electrode of the first transistor and a first node and that receives a first scan signal; a fourth transistor connected between a first initialization voltage line that received a first initialization voltage and the first node and that receives a second scan signal; and a fifth transistor connected between a second initialization voltage line that receives a second initialization voltage and an anode of the first light emitting element and that receives a third scan signal.

In an embodiment, each of the third transistor and the fourth transistor may be an oxide semiconductor transistor.

In an embodiment, the display device may further include a plurality of scan lines that extend in a second direction that intersects the first direction. The plurality of scan lines may include an initialization scan line, a compensation scan line, a write scan line, and a black scan line that are connected to the first pixel and the second pixel.

In an embodiment of the inventive concept, a display device includes: a base layer; and a pixel layer disposed on the base layer. The pixel layer includes a plurality of pixels, a plurality of sensors, a plurality of scan lines electrically connected to the plurality of pixels, a plurality of data lines electrically connected to the plurality of pixels, and a plurality of readout lines electrically connected to the plurality of sensors. The plurality of readout lines are disposed on a different layer than at least some of the plurality of data lines.

In an embodiment, the plurality of readout lines may include a readout line, and the plurality of data lines may include a first data line and a second data line. When viewed in a plan view, the readout line may be disposed between the first data line and the second data line, and a distance between the first data line and the readout line may be greater than or equal to a distance between the second data line and the readout line.

In an embodiment, the first data line and the second data line may be disposed on a same layer, and the readout line may be disposed on a different layer from the first data line and the second data line.

In an embodiment, the first data line and the readout line may be disposed on the same layer, and the second data line may be disposed on a different layer from the first data line and the readout line.

In an embodiment, the display device may further include an organic layer disposed between the second data line and the readout line.

In an embodiment, the plurality of pixels may include a plurality of green pixels, a plurality of red pixels, and a plurality of blue pixels. The plurality of green pixels may be connected to the first data line, and the plurality of red pixels and the plurality of blue pixels may be connected to the second data line.

DETAILED DESCRIPTION

Figure 1:
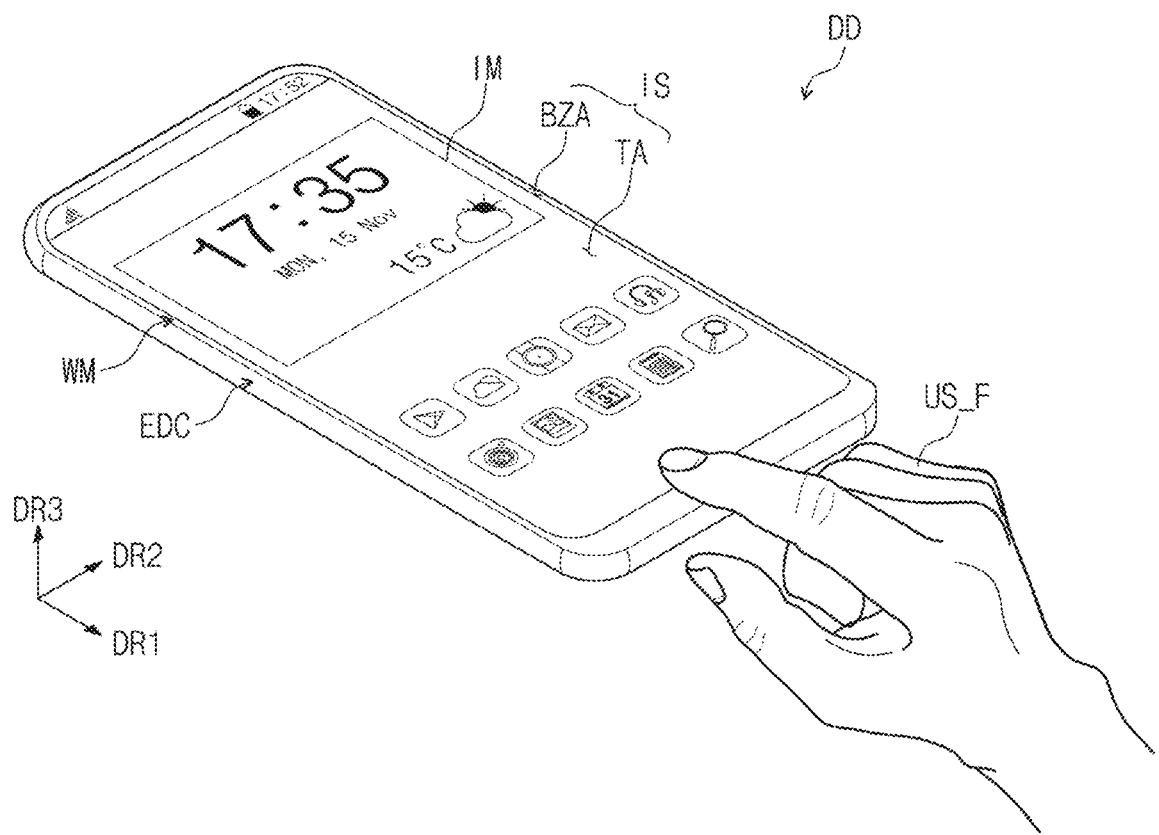
FIG. 1 is a perspective view of a display device according to an embodiment.

In this specification, when an element, or region, layer, part, etc., is also referred to as being "on", "connected to", or "coupled to" another element, it means that it may be directly placed on/connected to/coupled to other components, or a third component may be arranged between them.

Like reference numerals may refer to like elements. It is to be understood that in the drawings, the relative thicknesses, proportions, angles, and dimensions of components are intended to be drawn to scale for at least one embodiment of the present disclosure, however, changes may be made to these characteristics within the scope of the present disclosure and the present inventive concept is not necessarily limited to the properties shown. The expression "and/or" includes one or more combinations which associated components are capable of defining.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of components shown in the drawing. The terms are described as a relative concept based on a direction shown in the drawing.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which this inventive concept belongs. In addition, terms such as terms defined in commonly used dictionaries should be interpreted as having a meaning consistent with the meaning in the context of the related technology, and it should not be construed in an overly ideal or overly formal sense unless explicitly defined here.

Hereinafter, embodiments of the inventive concept will be described with reference to the drawings.

Figure 2:
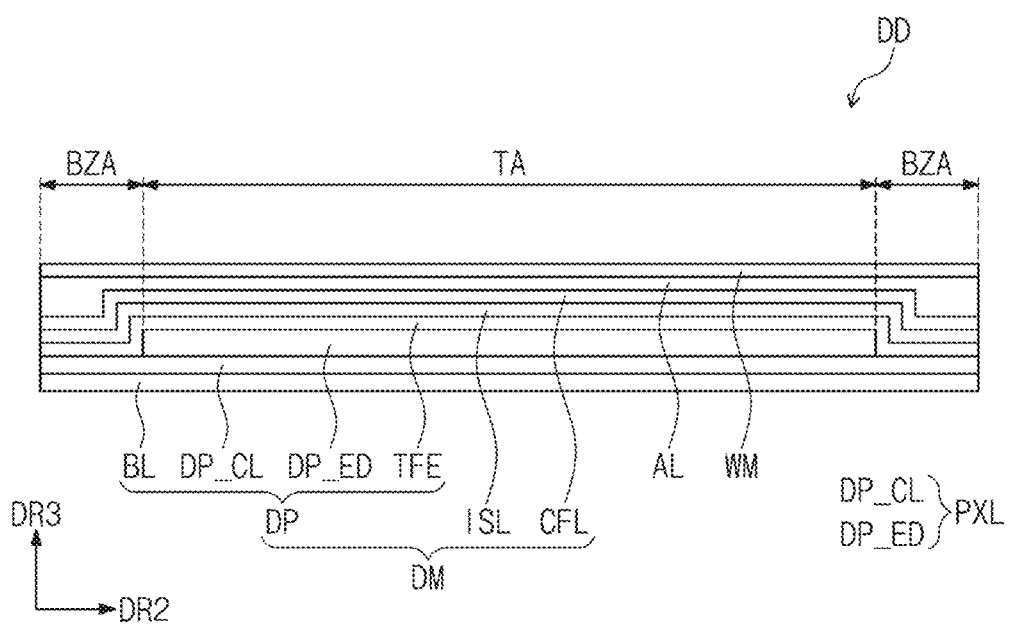
FIG. 2 is a cross-sectional view of a display device according to an embodiment.

FIG. 1 is a perspective view of a display device DD according to an embodiment of the inventive concept. FIG. 2 is a cross-sectional view of a display device DD according to an embodiment of the inventive concept.

Referring to FIGS. 1 and 2, in an embodiment, the display device DD is activated according to an electrical signal. For example, the display device DD may be one of a mobile phone, a tablet, a car navigation system, a game console, or a wearable device, but is not limited thereto. FIG. 1 illustrates that the display device DD is a mobile phone.

The upper surface of the display device DD is a display surface IS and is parallel to a plane defined by a first direction DR1 and a second direction DR2 that crosses the first direction. The images IM generated by the display device DD are displayed to the user through the display surface IS. Hereinafter, a direction substantially perpendicular to the plane defined by the first direction DR1 and the second direction DR2 is defined as the third direction DR3. In this specification, the meaning of "when viewed in a plan view" mean a state viewed from the third direction DR3.

The display surface IS is divided into a transmission area TA and a bezel area BZA. The transmission area TA is where images IM are displayed. The user recognizes the images IM through the transmission area TA. In an embodiment, the transmission area TA has a rectangular shape with rounded vertices. However, embodiments are not necessarily limited thereto, and in other embodiments, the transmission area TA has various other shapes.

The bezel area BZA is adjacent to the transmission area TA. The bezel area BZA has a predetermined color. The bezel area BZA surrounds the transmission area TA. Accordingly, the shape of the transmission area TA is substantially defined by the bezel area BZA. However, embodiments are not necessarily limited thereto, and in other embodiments, the bezel area BZA is adjacent to only one side of the transmission area TA, or is omitted.

The display device DD can sense an externally applied input. The externally applied input may be one of various types of inputs received from the outside of the display device DD. For example, the external input may include an external input that is applied close to or spaced a predetermined distance from the display device DD, such as hovering, as well as a contact by a portion of the body, such as a user's hand US_F. In addition, the external input may have various forms such as a force, a pressure, a temperature, light, etc. The external input may be provided by a separate device, such as an active pen or a digitizer pen.

The display device DD can detect the user's biometric information from the externally applied input. A biometric information detection area that can detect the user's biometric information is provided on the display surface IS of the display device DD. The biometric information detection area may be provided in the entire area of the transmission area TA or may be provided in a partial area of the transmission area TA. FIG. 1 illustrates that the entire transmission area TA is used as a biometric information detection area, but embodiments of the inventive concept are not necessarily limited thereto, and in other embodiments, a biometric information detection area is provided in a portion of the transmission area TA.

The exterior of the display device DD is configured by a window WM and a housing EDC. For example, the window WM and the housing EDC are coupled to each other, and other components of the display device DD, such as a display module DM, are accommodated therein.

The front surface of the window WM forms the display surface IS of the display device DD. The window WM includes an optically transparent insulating material. For example, the window WM includes glass or plastic. The window WM may have a multilayer structure or a single layer structure. For example, the window WM includes a plurality of plastic films bonded with an adhesive, or a glass substrate and a plastic film bonded with an adhesive.

The housing EDC includes a highly rigid material. For example, the housing EDC includes a plurality of frames and/or plates made of glass, plastic, or metal, or a combination thereof. The housing EDC stably protects components of the display device DD accommodated in the internal space from external impacts. In addition, a battery module that supplies power for the overall operation of the display device DD may be disposed between the display module DM and the housing EDC.

The display module DM includes a display panel DP, an input detection layer ISL, and an anti-reflection layer CFL.

The display panel DP is a component that substantially generates an image. The display panel DP is a light emitting display panel, and, for example, the display panel DP is one of an organic light emitting display panel, an inorganic light emitting display panel, an organic-inorganic light emitting display panel, a quantum dot display panel, a micro LED display panel, or a nano LED display panel. Hereinafter, the display panel DP is described as an organic light emitting display panel.

The display panel DP includes a base layer BL, a pixel layer PXL, and an encapsulation layer TFE. The display panel DP according to the inventive concept is a flexible display panel. However, embodiments of the inventive concept are not necessarily limited thereto. For example, in other embodiments, the display panel DP is a foldable display panel or a rigid display panel that can be folded about a folding axis.

The base layer BL includes a synthetic resin layer. The synthetic resin layer is a polyimide resin layer, but the material thereof is not necessarily limited thereto. In addition, the base layer BL may include a glass substrate, a metal substrate, or an organic/inorganic composite material substrate.

The pixel layer PXL is disposed on the base layer BL. The pixel layer PXL includes a circuit layer DP_CL and an element layer DP_ED. The circuit layer DP_CL is disposed between the base layer BL and the element layer DP_ED.

The circuit layer DP_CL includes at least one insulating layer and a circuit element. Hereinafter, the insulating layer in the circuit layer DP_CL is referred to as an intermediate insulating layer. The intermediate insulating layer includes at least one intermediate inorganic layer and at least one intermediate organic layer. The circuit element includes a pixel driving circuit in each of the plurality of pixels that display an image and a sensor driving circuit in each of the plurality of sensors that recognize external information. The external information may be biometric information. For example, the sensor is one of a fingerprint recognition sensor, a proximity sensor, an iris recognition sensor, etc. In addition, the sensor may be an optical sensor that recognizes biometric information in an optical manner. The circuit layer DP_CL further includes signal lines connected to the pixel driving circuit and/or the sensor driving circuit.

The element layer DP_ED includes a light emitting element in each of the pixels and a light detection element in each of the sensors. For example, the light detection element is a photodiode. The light detection element is a sensor that senses or responds to light reflected by a user's fingerprint. The circuit layer DP_CL and the element layer DP_ED will be described in detail below with reference to FIGS. 7, 8A, and 8B.

The encapsulation layer TFE encapsulates the element layer DP_ED. The encapsulation layer TFE includes at least one organic layer and at least one inorganic layer. The inorganic layer includes an inorganic material and protects the element layer DP_ED from moisture/oxygen. The inorganic film is one of a silicon nitride layer, a silicon oxynitride layer, a silicon oxide layer, a titanium oxide layer, or an aluminum oxide layer, but embodiments are not necessarily limited thereto. The organic layer includes an organic material, and protects the element layer DP_ED from foreign substances such as dust particles.

An input detection layer ISL is formed on the display panel DP. The input detection layer ISL is directly disposed on the encapsulation layer TFE. According to an embodiment of the inventive concept, the input detection layer ISL is formed on the display panel DP by a continuous process. That is, when the input detection layer ISL is directly disposed on the display panel DP, no adhesive film is disposed between the input detection layer ISL and the encapsulation layer TFE. Alternatively, in an embodiment, an adhesive film is disposed between the input detection layer ISL and the display panel DP. For example, the input detection layer ISL is not manufactured by a continuous process with the display panel DP, and after being manufactured through a process separate from that of the display panel DP, the input detection layer ISL is fixed to the upper surface of the display panel DP by the adhesive film.

The input detection layer ISL detects an external input, such as a user's touch, changes the detected external input into a predetermined input signal, and provides the input signal to the display panel DP. The input detection layer ISL includes a plurality of detection electrodes that detect an external input. The detection electrodes detect an external input in a capacitive manner. The display panel DP receives an input signal from the input detection layer ISL and generate an image that corresponds to the input signal.

An anti-reflection layer CFL is disposed over the input detection layer ISL. The anti-reflection layer CFL reduces reflectance of external light incident on the display device DD. The anti-reflection layer CFL is formed on the input detection layer ISL through a continuous process, but embodiments of the inventive concept are not necessarily limited thereto. For example, in an embodiment, the anti-reflection layer CFL is disposed between the display panel DP and the input detection layer ISL. The anti-reflection layer CFL includes color filters. The color filters have a predetermined arrangement. For example, the color filters are arranged in consideration of emission colors of pixels in the display panel DP. In addition, the anti-reflection layer CFL further includes a black matrix adjacent to the color filters.

The display device DD according to an embodiment further includes an adhesive layer AL. The window WM is attached to the anti-reflection layer CFL by the adhesive layer AL. The adhesive layer AL is one of an optical clear adhesive, an optically clear adhesive resin, or a pressure sensitive adhesive (PSA).

Figure 3:
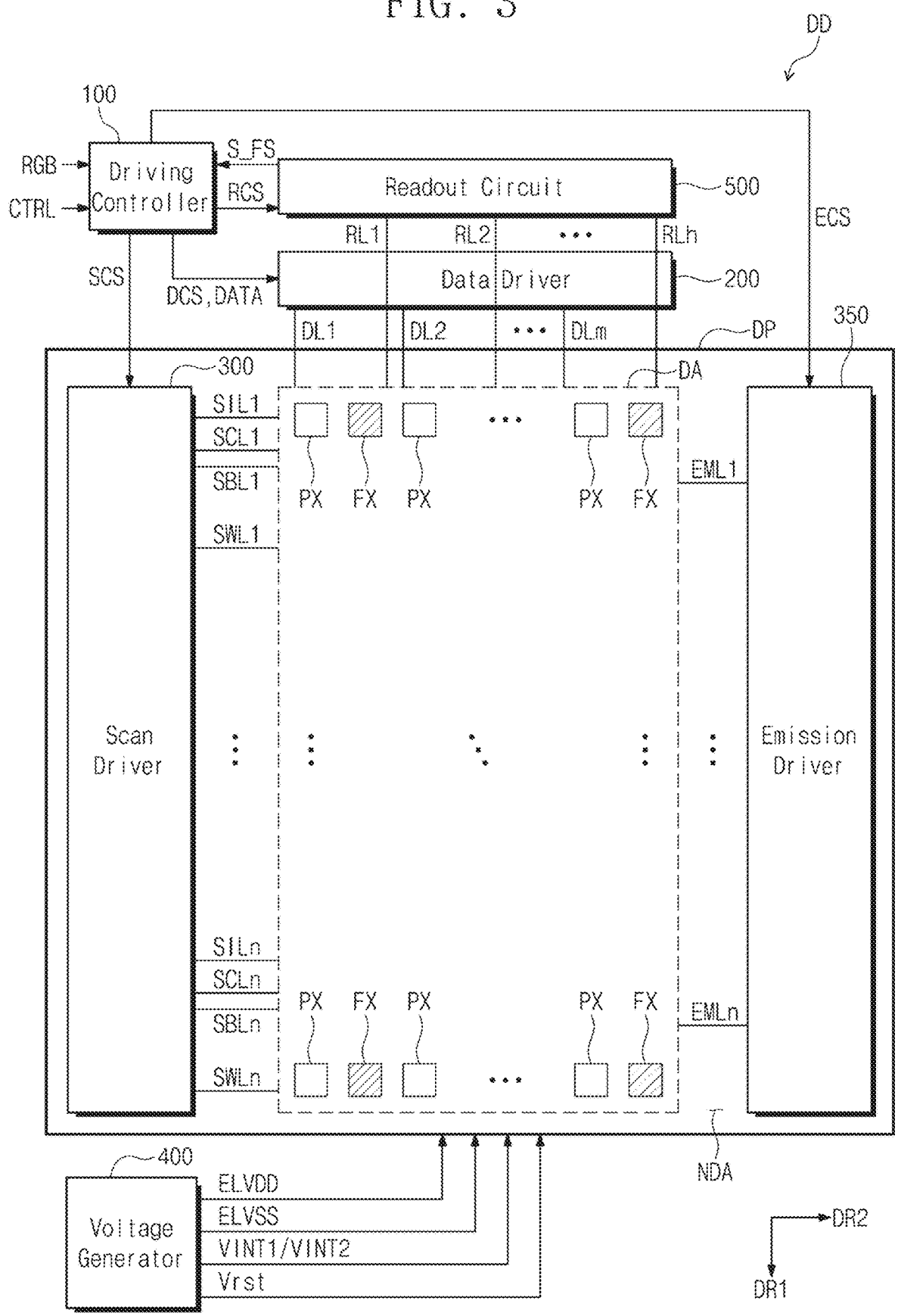
FIG. 3 is a block diagram of a display device according to an embodiment.

FIG. 3 is a block diagram of a display device DD according to an embodiment.

Referring to FIG. 3, in an embodiment, the display device DD includes a display panel DP, a panel driver, and a driving controller 100. For example, the panel driver includes a data driver 200, a scan driver 300, an emission driver 350, a voltage generator 400, and a readout circuit 500.

The driving controller 100 receives an image signal RGB and a control signal CTRL. The driving controller 100 generates an image data signal DATA by converting a data format of the image signal RGB to meet the specification of an interface with the data driver 200. The driving controller 100 outputs a first control signal SCS, a second control signal ECS, a third control signal DCS, and a fourth control signal RCS.

The data driver 200 receives the third control signal DCS and the image data signal DATA from the driving controller 100. The data driver 200 converts the image data signal DATA into data signals, and outputs the data signals to a plurality of data lines DL1 to DLm, which will be described below. The data signals are analog voltages that correspond to the grayscale value of the image data signal DATA.

The scan driver 300 receives the first control signal SCS from the driving controller 100. The scan driver 300 outputs scan signals to scan lines in response to the first control signal SCS.

The voltage generator 400 generates voltages that operate the display panel DP. In an embodiment, the voltage generator 400 generates a first driving voltage ELVDD, a second driving voltage ELVSS, a first initialization voltage VINT1, a second initialization voltage VINT2, and a reset voltage Vrst.

The display panel DP includes a display area DA that corresponds to the transmission area TA (see FIG. 1) and a non-display area NDA that corresponds to the bezel area BZA (see FIG. 1).

The display panel DP includes a plurality of pixels PX disposed in the display area DA and a plurality of sensors FX disposed in the display area DA. For example, each of the plurality of sensors FX is disposed between two adjacent pixels PX. The plurality of pixels PX and the plurality of sensors FX are alternately disposed in the first and second directions DR1 and DR2. However, embodiments of the inventive concept are not necessarily limited thereto. For example, in some embodiments, two or more pixels PX are disposed between two sensors FX adjacent to each other in the first direction DR1, and/or two or more pixels PX are disposed between two sensors FX adjacent to each other in the second direction DR2.

The display panel DP further includes initialization scan lines SIL1 to SILn, compensation scan lines SCL1 to SCLn, write scan lines SWL1 to SWLn, black scan lines SBL1 to SBLn, emission control lines EML1 to EMLn, data lines DL1 to DLm, and readout lines RL1 to RLh. Each of n, m, and h is a positive integer of 2 or more.

The initialization scan lines SIL1 to SILn, the compensation scan lines SCL1 to SCLn, the write scan lines SWL1 to SWLn, the black scan lines SBL1 to SBLn, and the emission control lines EML1 to EMLn extend in the second direction DR2. The initialization scan lines SIL1 to SILn, the compensation scan lines SCL1 to SCLn, the write scan lines SWL1 to SWLn, the black scan lines SBL1 to SBLn, and the emission control lines EML1 to EMLn are spaced apart from each other in the first direction DR1. The data lines DL1 to DLm and the readout lines RL1 to RLh extend in the first direction DR1 and are spaced apart from each other in the second direction DR2.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the emission control lines EML1 to EMLn, and the data lines DL1 to DLm, respectively. For example, each of the plurality of pixels PX is electrically connected to four scan lines. However, the number of scan lines connected to each pixel PX is not necessarily limited thereto and can change in other embodiments.

The plurality of sensors FX are electrically connected to the write scan lines SWL1 to SWLn and the readout lines RL1 to RLh, respectively. One sensor FX is electrically connected to one scan line. However, embodiments of the inventive concept are not necessarily limited thereto. In some embodiments, the number of scan lines connected to each sensor FX varies. For example, the number of readout lines RL1 to RLh may correspond to ½ of the number of data lines DL1 to DLm, or the number of may correspond to ¼ or ⅛ of the number of data lines DL1 to DLm.

The scan driver 300 is disposed in the non-display area NDA of the display panel DP. However, embodiments of the inventive concept are not necessarily limited thereto. For example, in an embodiment, at least a portion of the scan driver 300 is disposed in the display area DA.

The scan driver 300 receives the first control signal SCS from the driving controller 100. The scan driver 300 outputs initialization scan signals to the initialization scan lines SIL1 to SILn in response to the first control signal SCS, and outputs compensation scan signals to the compensation scan lines SCL1 to SCLn. In addition, the scan driver 300 outputs write scan signals to the write scan lines SWL1 to SWLn in response to the first control signal SCS, and outputs black scan signals to the black scan lines SBL1 to SBLn. However, embodiments of the inventive concept are not necessarily limited thereto. For example, in an embodiment, the scan driver 300 includes first and second scan drivers. The first scan driver outputs initialization scan signals and compensation scan signals, and the second scan driver outputs write scan signals and black scan signals.

The emission driver 350 is disposed in the non-display area NDA of the display panel DP. The emission driver 350 receives the second control signal ECS from the driving controller 100. The emission driver 350 outputs emission control signals to the emission control lines EML1 to EMLn in response to the second control signal ECS. However, embodiments of the inventive concept are not necessarily limited thereto. For example, in an embodiment, the scan driver 300 is connected to the emission control lines EML1 to EMLn. For example, the emission driver 350 is omitted, and the scan driver 300 outputs emission control signals to the emission control lines EML1 to EMLn.

The readout circuit 500 is disposed in the non-display area NDA of the display panel DP. The readout circuit 500 receives the fourth control signal RCS from the driving controller 100. The readout circuit 500 receives detection signals from the readout lines RL1 to RLh in response to the fourth control signal RCS. The readout circuit 500 processes detection signals received from the readout lines RL1 to RLh and provide the processed detection signals S_FS to the driving controller 100. The driving controller 100 recognizes biometric information based on the detection signals S_FS.

Figure 4A:
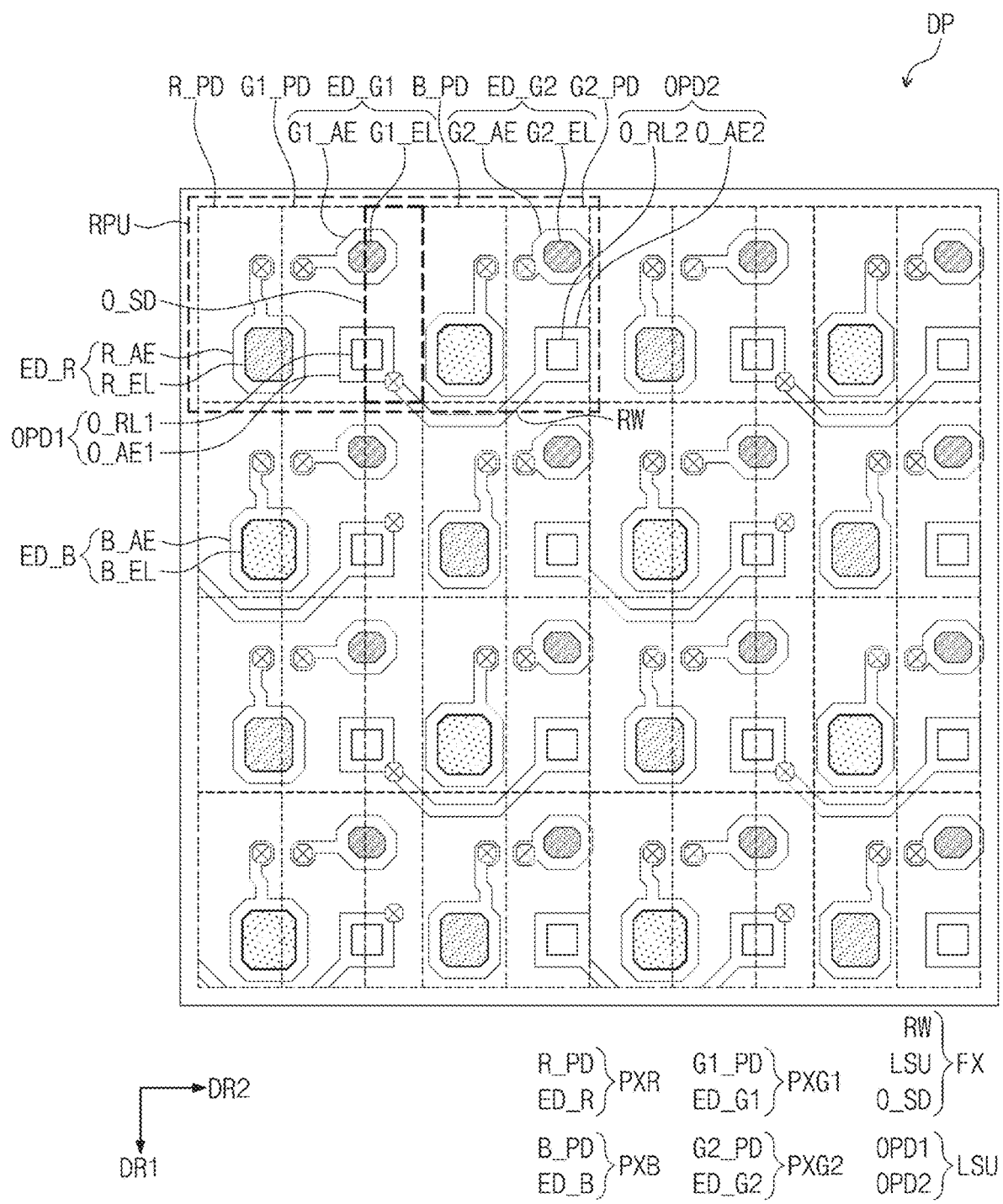
FIG. 4A is an enlarged plan view of a partial area of a display panel according to embodiments.

FIG. 4A is an enlarged plan view of a partial area of the display panel DP according to embodiments.

Referring to FIG. 4A, in an embodiment, the display panel DP includes a plurality of pixels PXR, PXG1, PXG2, and PXB and a plurality of sensors FX.

The plurality of pixels PXR, PXG1, PXG2, and PXB are grouped into a plurality of reference pixel units RPU. For example, each reference pixel unit RPU includes two first pixels PXG1 and PXG2, hereinafter referred to as first and second green pixels, a second pixel PXR, hereinafter referred to as a red pixel, and a third pixel PXB, hereinafter referred to as a blue pixel. However, the number of pixels included in each reference pixel unit RPU is not necessarily limited thereto. For example, in some embodiments, each reference pixel unit RPU includes three pixels, such as a first green pixel PXG1 or a second green pixel PXG2, a red pixel PXR, and a blue pixel PXB.

The first and second green pixels PXG1 and PXG2 include first light emitting elements ED_G1 and ED_G2, hereinafter referred to as first and second green light emitting elements, respectively, the red pixel PXR includes a second light emitting element ED_R, hereinafter referred to as a red light emitting element, and the blue pixel PXB includes a third light emitting element ED_B, hereinafter referred to as a blue light emitting element. For example, each of the first and second green light emitting elements ED_G1 and ED_G2 outputs a first color light, such as green light, the red light emitting element ED_R outputs a second color light, such as red light, that differs from the first color light, and the blue light emitting element ED_B outputs a third color light, such as blue light, that differs from the first and second color lights. The green light output from the first green light emitting element ED_G1 has the same wavelength band as the green light output from the second green light emitting element ED_G2.

The red light emitting elements ED_R and the blue light emitting elements ED_B are alternately and repeatedly disposed in the first and second directions DR1 and DR2. The first and second green light emitting elements ED_G1 and ED_G2 are alternately and repeatedly disposed in the first direction DR1 and the second direction DR2. The first and second green light emitting elements ED_G1 and ED_G2 are disposed in different rows and different columns from the red light emitting elements ED_R and blue light emitting elements ED_B in the first and second directions DR1 and DR2.

The red light emitting element ED_R has a larger size than the first and second green light emitting elements ED_G1 and ED_G2. In addition, the blue light emitting element ED_B has a size that is greater than or equal to that of the red light emitting element ED_R. However, the size of each of the light emitting elements ED_R, ED_G1, ED_G2, and ED_B is not necessarily limited thereto, and can variously modified in other embodiments. For example, in an embodiment of the inventive concept, the light emitting elements ED_R, ED_G1, ED_G2, and EDB have the same size.

The first green light emitting element ED_G1 is electrically connected to the first green pixel driving circuit G1_PD. For example, the first green light emitting element ED_G1 includes a first green anode G1_AE and a first green light emitting layer G1_EL, and the first green anode G1_AE is connected to the first green pixel driving circuit G1_PD through a contact hole. The second green light emitting element ED_G2 is electrically connected to the second green pixel driving circuit G2_PD. For example, the second green light emitting element ED_G2 includes a second green anode G2_AE and a second green light emitting layer G2_EL, and the second green anode G2_AE is connected to the second green pixel driving circuit G2_PD through a contact hole.

The first green light emitting layer G1_EL and the second green light emitting layer G2_EL have the same size. The first green light emitting layer G1_EL and the second green light emitting layer G2_EL have the same or different shapes. For example, the first green light emitting layer G1_EL and the second green light emitting layer G2_EL have different shapes in a plan view. The first green anode G1_AE and the second green anode G2_AE have different sizes and different shapes.

The red light emitting element ED_R is electrically connected to the red pixel driving circuit R_PD. For example, the red light emitting element ED_R includes a red anode R_AE and a red light emitting layer R_EL, and the red anode R_AE is connected to the red pixel driving circuit R_PD through a contact hole. The blue light emitting element ED_B is electrically connected to the blue pixel driving circuit B_PD. For example, the blue light emitting element ED_B includes a blue anode B_AE and a blue light emitting layer B_EL, and the blue anode B_AE is connected to the blue pixel driving circuit B_PD through a contact hole.

Each of the sensors FX includes a light detection unit LSU and a sensor driving circuit O_SD. The light detection unit LSU includes at least one light detection element. For example, a light detection unit LSU includes k light detection elements, and one of the k light detection elements is connected to the sensor driving circuit. For example, k is a positive integer of 2 or more. FIG. 4A illustrates a case where k is 2. When k is 2, the light detection unit LSU includes two light detection elements, hereinafter referred to as first and second light detection elements OPD1 and OPD2. For example, the first and second light detection elements OPD1 and OPD2 are disposed in one reference pixel unit RPU. However, the number of light detection elements disposed in each reference pixel unit RPU is not necessarily limited thereto. For example, in an embodiment, one light detection element is disposed in each reference pixel unit RPU.

Each of the first and second light detection elements OPD1 and OPD2 is disposed between the red light emitting element ED_R and the blue light emitting element ED_B in the second direction DR2. Each of the first and second light detection elements OPD1 and OPD2 is adjacent to the first green light emitting element ED_G1 or the second green light emitting element ED_G2 in the first direction DR1. In the first reference pixel unit row, the first light detection element OPD1 and the first green light emitting element ED_G1 are adjacent to each other in the first direction DR1, and the second light detection element OPD2 and the second green light emitting element ED_G2 are adjacent to each other in the first direction DR1. In the second reference pixel unit row, the first light detection element OPD1 and the second green light emitting element ED_G2 are adjacent to each other in the first direction DR1, and the second light detection element OPD2 and the first green light emitting element ED_G1 are adjacent to each other in the first direction DR1. For example, each of the first and second light detection elements OPD1 and OPD2 is disposed between the first and second green light emitting elements ED_G1 and ED_G2 that are adjacent to each other in the first direction DR1.

The sensor driving circuit O_SD is connected to one of the first and second light detection elements OPD1 and OPD2, such as the first light detection element OPD1. The sensor driving circuit O_SD has the same length as the red and blue pixel driving circuits R_PD and B_PD in the first direction DR1. The sensor driving circuit O_SD overlaps one of the first and second light detection elements OPD1 and OPD2 in a plan view, such as the first light detection element OPD1. The sensor driving circuit O_SD overlaps one of the first and second green light emitting elements ED_G1 and ED_G2 in a plan view, such as the first green light emitting element ED_G1.

The first light detection element OPD1 includes a first anode O_AE1 and a first photoelectric conversion layer O_RL1, and the second light detection element OPD2 includes a second anode O_AE2 and a second photoelectric conversion layer O_RL2. The first anode O_AE1 is directly connected to the sensor driving circuit O_SD through a contact hole.

Each of the sensors FX further includes a routing line RW that electrically connects the first and second light detection elements OPD1 and OPD2 to each other. The routing line RW is electrically connected to the first anode O_AE1 and the second anode O_AE2. For example, the routing line RW is integrally formed with the first anode O_AE1 and the second anode O_AE2. The routing line RW may be referred to as a routing wire RW or a routing portion RW.

The routing line RW, the first anode O_AE1, and the second anode O_AE2 are disposed on the same layer as the anodes R_AE, G1_AE, G2_AE, and B_AE. For example, the routing line RW, the first anode O_AE1, and the second anode O_AE2 include the same material as the anodes R_AE, G1_AE, G2_AE, and B_AE, and are formed through a same process.

The first and second light detection elements OPD1 and OPD2 are connected in parallel to the sensor driving circuit O_SD by the routing lines RW. Accordingly, the first and second light detection elements OPD1 and OPD2 can be simultaneously turned on or simultaneously turned off by the sensor driving circuit O_SD.

Figure 4B:
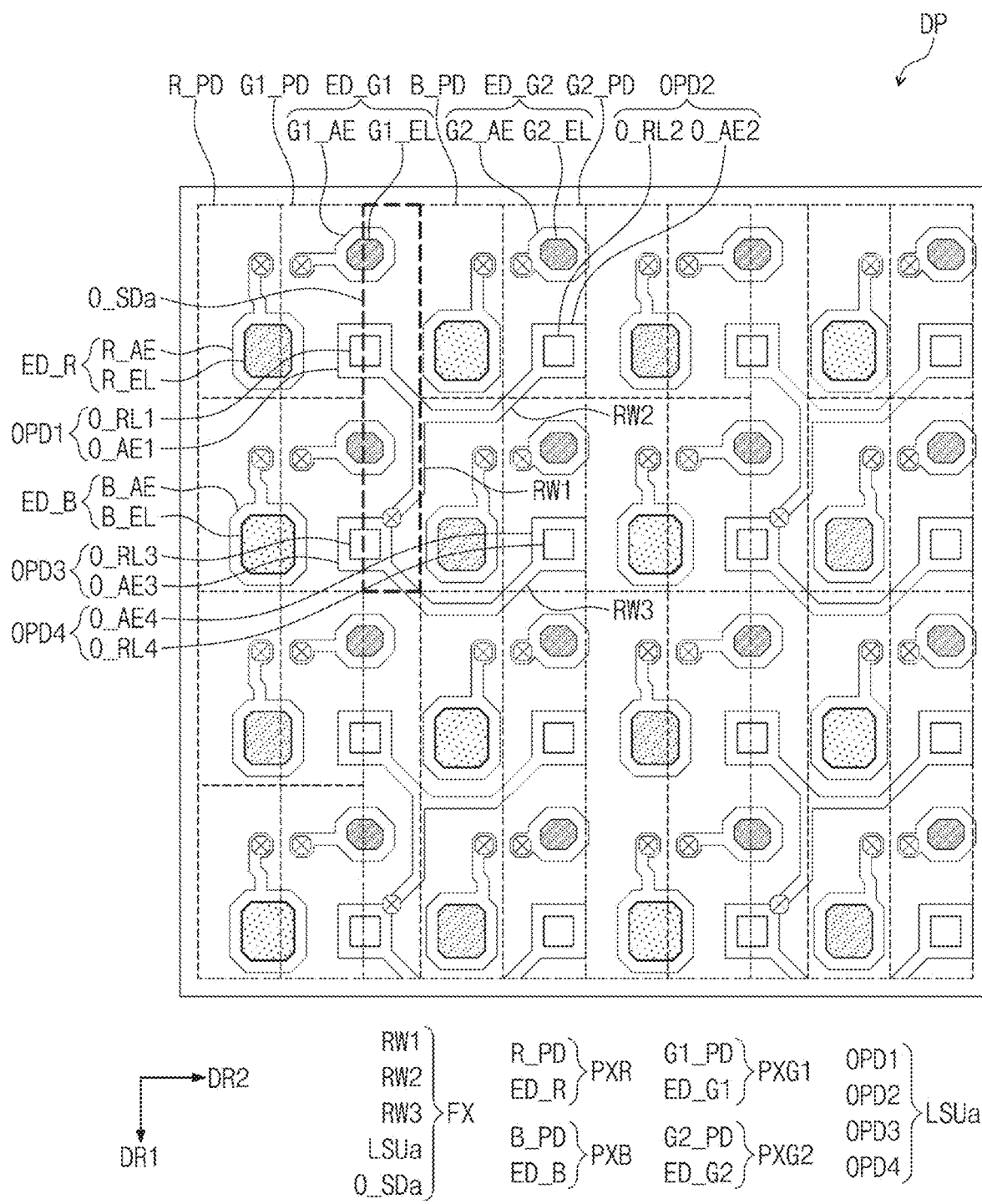
FIG. 4B is an enlarged plan view of a partial area of a display panel according to embodiments.

FIG. 4B is an enlarged plan view of a partial area of the display panel DP according to example embodiments.

As shown in FIG. 4B, in an embodiment, when k is 4, the light detection unit LSUa may include four light detection elements, hereinafter referred to as first to fourth light detection elements OPD1, OPD2, OPD3, and OPD4. One of the first to fourth light detection elements OPD1, OPD2, OPD3, and OPD4, such as a third light detection element OPD3, is connected to the sensor driving circuit O_SDa.

Each of the sensors FX further includes three routing lines, hereinafter referred to as first to third routing lines RW1, RW2, and RW3, that electrically connect the first to fourth light detection elements OPD1, OPD2, OPD3, and OPD4. The first routing line RW1 electrically connects two light detection elements adjacent in the first direction DR1, such as the first and third light detection elements OPD1 and OPD3. The second routing line RW2 electrically connects two light detection elements adjacent in the second direction DR2, such as first and second light detection elements OPD1 and OPD2. The third routing line RW3 electrically connects two light detection elements adjacent in the second direction DR2, such as the third and fourth light detection elements OPD3 and OPD4.

The first light detection element OPD1 includes a first anode O_AE1 and a first photoelectric conversion layer O_RL1, the second light detection element OPD2 includes a second anode O_AE2 and a second photoelectric conversion layer O_RL2, The third light detection element OPD3 includes a third anode O_AE3 and a third photoelectric conversion layer O_RL3, and the fourth light detection element OPD4 includes a fourth anode O_AE4 and a fourth photoelectric conversion layer O_RL4. The third anode O_AE3 is directly connected to the sensor driving circuit O_SDa through a contact hole. The sensor driving circuit O_SDa has a length in the first direction DR1 that is greater than that of the red and blue pixel driving circuits R_PD and B_PD. Accordingly, the sensor driving circuit O_SDa overlaps two of the first to fourth light detection elements OPD1 to OPD4 in a plan view, such as the first and third light detection elements OPD1 and OPD3, or the first and second green light emitting elements ED_G1 and ED_G2.

The first routing line RW1 is electrically connected to the first anode O_AE1 and the third anode O_AE3, the second routing line RW2 is electrically connected to the first anode O_AE1 and the second anode O_AE2, and the third routing line RW3 is electrically connected to the third anode O_AE3 and the fourth anode O_AE4. For example, the first to third routing lines RW1 to RW3 are integrally formed with the first to fourth anodes O_AE1 to O_AE4.

The first to third routing lines RW1, RW2, and RW3 and the first to fourth anodes O_AE1 to O_AE4 are disposed on the same layer as the anodes R_AE, G1_AE, G2_AE, and B_AE. For example, the first to third routing lines RW1, RW2, and RW3 and the first to fourth anodes O_AE1 to O_AE4 include the same material as the anodes R_AE, G1_AE, G2_AE, and B_AE, and are formed through the same process.

The first to fourth light detection elements OPD1, OPD2, OPD3, and OPD4 are connected in parallel to the sensor driving circuit O_SDa by the first to third routing lines RW1, RW2, and RW3. Accordingly, the first to fourth light detection elements OPD1, OPD2, OPD3, and OPD4 can be simultaneously turned on or simultaneously turned off by the sensor driving circuit O_SDa.

Referring to FIGS. 4A and 4B, in an embodiment, the sensor driving circuits O_SD and O_SDa each include a plurality of transistors. For example, the sensor driving circuits O_SD and O_SDa and the pixel driving circuits R_PD, G1_PD, G2_PD, and B_PD are simultaneously formed through the same process. In addition, the scan driver 300 (see FIG. 3) includes transistors formed through the same process as the sensor driving circuits O_SD and O_SDa and the pixel driving circuits R_PD, G1_PD, G2_PD, and B_PD.

Figure 5:
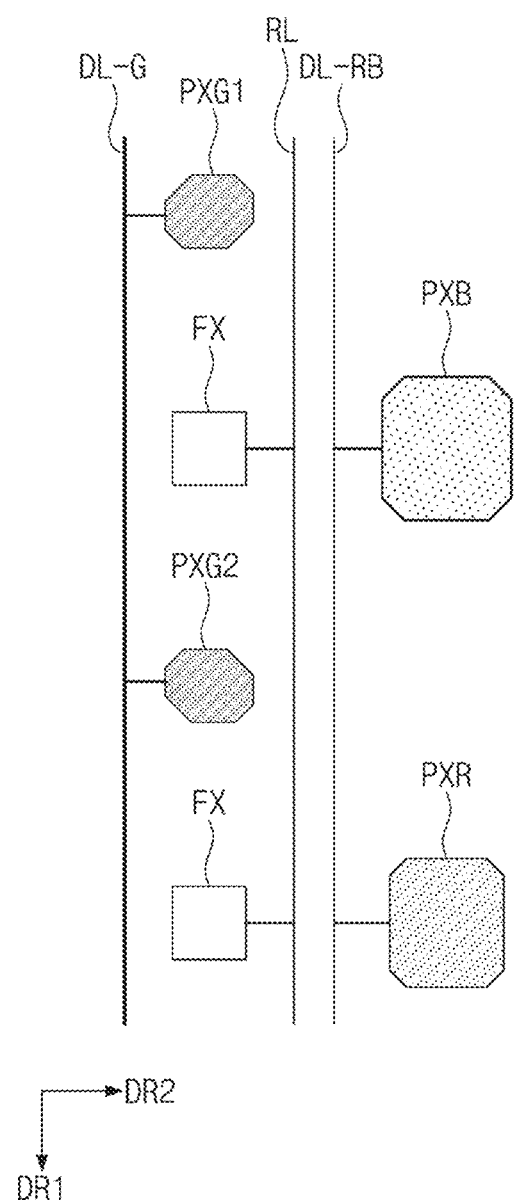
FIG. 5 is a plan view of a configuration of a display panel according to an embodiment.

FIG. 5 is a plan view of a configuration of a display panel according to an embodiment of the inventive concept.

Referring to FIG. 5, in an embodiment, a first data line DL-G, a second data line DL-RB, a readout line RL, first pixels PXG1 and PXG2 connected to the first data line DL-G, a second pixel PXR and a third pixel PXB connected to the second data line DL-RB, and sensors FX connected to the readout line RL are illustrated by way of example.

The readout line RL is disposed between the first data line DL-G and the second data line DL-RB, and the first data line DL-G and the second data line DL-RB and the readout line RL each extend in the first direction DR1.

The readout line RL is disposed on a different layer from at least one of the first data line DL-G and the second data line DL-RB. For example, a phenomenon in which the readout line RL is coupled to an adjacent data line, such as the second data line DL-RB, is reduced or eliminated. Accordingly, noise generated in the detection signal provided to the readout line RL by the voltage applied to the second data lines DL-RB is reduced. As a result, fingerprint sensing sensitivity and fingerprint sensing accuracy is increased.

Figure 6:
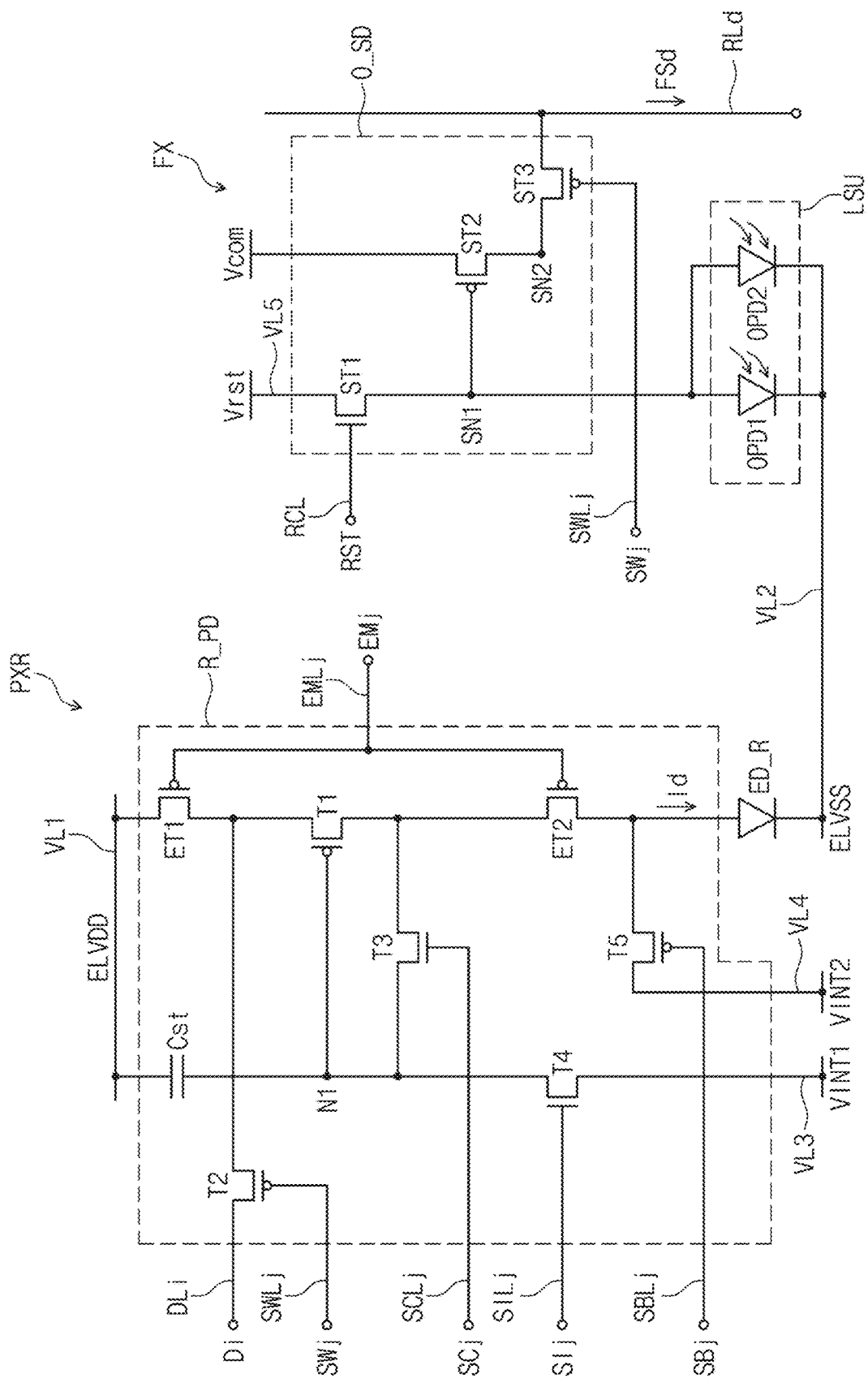
FIG. 6 is an equivalent circuit diagram of a pixel and a sensor according to an embodiment of the inventive concept.

FIG. 6 is an equivalent circuit diagram of a pixel and a sensor according to an embodiment of the inventive concept.

FIG. 6 illustrates an equivalent circuit diagram of one of the pixels PX, such as a red pixel PXR. Since each of the plurality of pixels PX has the same circuit structure, with a description of the circuit structure of the red pixel PXR, a detailed description of the remaining pixels will be omitted. In addition, FIG. 6 shows an equivalent circuit diagram of one of the sensors FX illustrated in FIG. 3. Since each of the plurality of sensors FX has the same circuit structure, with a description of the circuit structure of the sensor FX, a detailed description of the remaining pixels will be omitted.

Referring to FIGS. 3 and 6, in an embodiment, the red pixel PXR is connected to an i-th data line DLi, a j-th initialization scan line SILj, a j-th compensation scan SCLj, a j-th write scan line SWLj, a j-th black scan line SBLj, and a j-th emission control line EMLj.

The red pixel PXR includes a red light emitting element ED_R and a red pixel driving circuit R_PD. The red light emitting element ED_R ios a light emitting diode. For example, the red light emitting element ED_R is an organic light emitting diode that includes an organic light emitting layer.

The red pixel driving circuit R_PD includes first to fifth transistors T1, T2, T3, T4, and T5, first and second emission control transistors ET1 and ET2, and one capacitor Cst.

At least one of the first to fifth transistors T1, T2, T3, T4, and T5 and the first and second emission control transistors ET1 and ET2 includes a low-temperature polycrystalline silicon (LTPS) semiconductor layer. At least one of the first to fifth transistors T1, T2, T3, T4, and T5 and the first and second emission control transistors ET1 and ET2 may be a transistor having a oxide semiconductor layer. For example, the third and fourth transistors T3 and T4 are oxide semiconductor transistors, and the first, second, and fifth transistors T1, T2, and T5, and the first and second emission control transistors ET1 and ET2 are LTPS transistors.

For example, the first transistor T1 directly affects the brightness of the display device DD (see FIG. 1). When the first transistor T1 includes a semiconductor layer made of a highly reliable polycrystalline silicon, a high-resolution display device can be realized. On the other hand, since an oxide semiconductor has high carrier mobility and low leakage current, a voltage drop is not large even if the driving time is long. For example, since the color change of an image due to the voltage drop is not large even during low-frequency driving, low-frequency driving is possible. Thus, by configuring at least one of the third transistor T3 or the fourth transistor T4 that are connected to the driving gate electrode of the first transistor T1 as an oxide semiconductor, a leakage current that flows to the driving gate electrode is prevented and power consumption is reduced.

Some of the first to fifth transistors T1, T2, T3, T4, and T5 and the first and second emission control transistors ET1 and ET2 are P-type transistors, and the remaining are N-type transistors. For example, the first, second, and fifth transistors T1, T2, T5, and the first and second emission control transistors ET1 and ET2 are P-type transistors, and the third and fourth transistors T3 and T4 are N-type transistors.

The configuration of the red pixel driving circuit R_PD is not necessarily limited to an embodiment illustrated in FIG. 6, and the configuration of the red pixel driving circuit R_PD can be modified in other embodiments. For example, all of the first to fifth transistors T1, T2, T3, T4, and T5 and the first and second emission control transistors ET1 and ET2 may be P-type transistors or N-type transistors.

The j-th initialization scan line SILj, the j-th compensation scan line SCLj, the j-th write scan line SWLj, the j-th black scan line SBLj, and the j-th emission control line EMLj transmit the j-th initialization scan signal SIj, the j-th compensation scan signal SCj, the j-th write scan signal SWj, the j-th black scan signal SBj, and the j-th emission control signal EMj to the red pixel PXR, respectively. The i-th data line DLi transmits the i-th data signal Di to the red pixel PXR. The i-th data signal Di has a voltage level that corresponds to the image signal RGB input to the display device DD (see FIG. 3).

The first and second driving voltage lines VL1 and VL2 transmit the first driving voltage ELVDD and the second driving voltage ELVSS to the red pixel PXR, respectively. In addition, the first and second initialization voltage lines VL3 and VL4 transmit the first initialization voltage VINT1 and the second initialization voltage VINT2 to the red pixel PXR, respectively.

The first transistor T1 is connected between the first driving voltage line VL1 that receives the first driving voltage ELVDD and the red light emitting element ED_R. The first transistor T1 includes a first electrode connected to the first driving voltage line VL1 through the first emission control transistor ET1, a second electrode connected to the red anode (R_AE, see FIG. 4a) of the red light emitting element ED_R through the second emission control transistor ET2, and a third electrode, such as a gate electrode, connected to one end, such as the first node N1, of the capacitor Cst. The first transistor T1 receives the i-th data signal Di from the i-th data line DLi according to the switching operation of the second transistor T2, and supplies a driving current Id to the red light emitting element ED_R.

The second transistor T2 is connected between the data line DLi and the first electrode of the first transistor T1. The second transistor T2 includes a first electrode connected to the data line DLi, a second electrode connected to the first electrode of the first transistor T1, and a third electrode, such as a gate electrode, connected to the j-th write scan line SWLj. The second transistor T2 is turned on by the write scan signal SWj received through the j-th write scan line SWLj and transmits the i-th data signal Di transmitted from the i-th data line DLi to the first electrode of the first transistor T1.

The third transistor T3 is connected between the second electrode of the first transistor T1 and the first node N1. The third transistor T3 includes a first electrode connected to the third electrode of the first transistor T1, a second electrode connected to the second electrode of the first transistor T1, and a third electrode, such as a gate electrode, connected to the j-th compensation scan line SCLj. The third transistor T3 is turned on by the j-th compensation scan signal SCj received through the j-th compensation scan line SCLj and diode-connects the first transistor T1 by connecting the third electrode and the second electrode of the first transistor T1 to each other.

The fourth transistor T4 is connected between the first initialization voltage line VL3 that receives the first initialization voltage VINT1 and the first node N1. The fourth transistor T4 includes a first electrode connected to the first initialization voltage line VL3, a second electrode connected to the first node N1, and a third electrode, such as a gate electrode, connected to the j-th initialization scan line SILj. The fourth transistor T4 is turned on by the j-th initialization scan signal SIj received through the j-th initialization scan line SILj. The turned-on fourth transistor T4 transmits the first initialization voltage VINT1 to the first node N1 to initialize the potential of the first node N1 and the third electrode of the first transistor T1.

The first emission control transistor ET1 includes a first electrode connected to the first driving voltage line VL1, a second electrode connected to the first electrode of the first transistor T1, and a third electrode, such as a gate electrode, connected to the j-th emission control line EMLj.

The second emission control transistor ET2 includes a first electrode connected to the second electrode of the first transistor T1, a second electrode connected to a red anode R_AE (see FIG. 4A) of the red light emitting element ED_R, and a third electrode, such as a gate electrode, connected to the j-th emission control line EMLj.

The first and second emission control transistors ET1 and ET2 are simultaneously turned on by the j-th emission control signal EMj received through the j-th emission control line EMLj. The first driving voltage ELVDD received through the turned-on first emission control transistor ET1 is compensated by the diode-connected first transistor T1 and then transmitted to the red light emitting element ED_R.

The fifth transistor T5 includes a first electrode connected to the second initialization voltage line VL4 that receives the second initialization voltage VINT2, a second electrode connected to the second electrode of the second emission control transistor ET2, and a third electrode, such as a gate electrode, connected to the black scan line SBLj. The second initialization voltage VINT2 has a voltage level equal to or lower than that of the first initialization voltage VINT1. For example, each of the first and second initialization voltages VINT1 and VINT2 has a voltage of about −3.5V.

As described above, one end of the capacitor Cst is connected to the third electrode of the first transistor T1, and the other end is connected to the first driving voltage line VL1. The cathode of the red light emitting element ED_R is connected to the second driving voltage line VL2 that receives the second driving voltage ELVSS. The second driving voltage ELVSS has a lower voltage level than the first driving voltage ELVDD. For example, the first driving voltage ELVDD is about 4.6V, and the second driving voltage ELVSS is about −2.5V.

The sensor FX is connected to a d-th readout line RLd, a j-th write scan line SWLj, and a reset control line RCL.

The sensor FX includes a light detection unit LSU and a sensor driving circuit O_SD. The light detection unit LSU includes k light detection elements connected in parallel to each other. When k is 2, the first and second light detection elements OPD1 and OPD2 are connected to each other in parallel. Each of the first and second light detection elements OPD1 and OPD2 is a photodiode. For example, each of the first and second light detection elements OPD1 and OPD2 is an organic photodiode that includes an organic material as a photoelectric conversion layer. The first and second anodes O_AE1 and O_AE2 (see FIG. 4A) of the first and second light detection elements OPD1 and OPD2 are connected to a first sensing node SN1, and the first and second cathodes are connected to a second driving voltage line VL2 that transmits the second driving voltage ELVSS. When k is 4, the first to fourth light detection elements OPD1-OPD4 (see FIG. 4B) are connected in parallel to each other.

The sensor driving circuit O_SD includes three transistors ST1, ST2, and ST3. The three transistors ST1, ST2, and ST3 are a reset transistor ST1, an amplification transistor ST2, and an output transistor ST3, respectively. At least one of the reset transistor ST1, the amplification transistor ST2, or the output transistor ST3 is an oxide semiconductor transistor. For example, the reset transistor ST1 is an oxide semiconductor transistor, and the amplification transistor ST2 and the output transistor ST3 are LTPS transistors. However, embodiments of the inventive concept are not necessarily limited thereto, and in an embodiment, at least the reset transistor ST1 and the output transistor ST3 are oxide semiconductor transistors, and the amplification transistor ST2 is an LTPS transistor.

In addition, some of the reset transistor ST1, the amplification transistor ST2, and the output transistor ST3 are P-type transistors, and some are N-type transistors. For example, the amplification transistor ST2 and the output transistor ST3 are P-type transistors, and the reset transistor ST1 is an N-type transistor. However, embodiments of the inventive concept are not necessarily limited thereto, and in some embodiments, all of the reset transistor ST1, the amplification transistor ST2, and the output transistor ST3 are N-type transistors or P-type transistors.

The circuit configuration of the sensor driving circuit O_SD according to embodiments of the inventive concept is not necessarily limited to that shown in FIG. 6, and in other embodiments, the configuration of the sensor driving circuit O_SD is modified.

The reset transistor ST1 includes a first electrode connected to the third initialization voltage line VL5 to receive the reset voltage Vrst, a second electrode connected to the first sensing node SN1, and a third electrode that receives the reset control signal RST through the reset control line RCL. The reset transistor ST1 resets the potential of the first sensing node SN1 to the reset voltage Vrst in response to the reset control signal RST received through the reset control line RCL. However, embodiments of the inventive concept are not necessarily limited thereto. In an embodiment, the reset control signal RST is the j-th compensation scan signal SCj received through the j-th compensation scan line SCLj. For example, the reset transistor ST1 receives the j-th compensation scan signal SCj from the j-th compensation scan line SCLj as the reset control signal RST. For example, the reset voltage Vrst has a lower level than the second driving voltage ELVSS at least during the activation period of the reset control signal RST. The reset voltage Vrst is a DC voltage maintained at a level that is lower than that of the second driving voltage ELVSS. For example, the reset voltage Vrst is about −4.5V.

The amplification transistor ST2 includes a first electrode that receives the sensing driving voltage Vcom, a second electrode connected to the second sensing node SN2, and a third electrode connected to the first sensing node SN1. The amplification transistor ST2 is turned on by the potential of the first sensing node SN1 and applies the sensing driving voltage Vcom to the second sensing node SN2. For example, the sensing driving voltage Vcom is one of the first driving voltage ELVDD or the first and second initialization voltages VINT1 and VINT2. When the sensing driving voltage Vcom is the first driving voltage ELVDD, the first electrode of the amplification transistor ST2 is electrically connected to the first driving voltage line VL1. When the sensing driving voltage Vcom is the first initialization voltage VINT1, the first electrode of the amplification transistor ST2 is electrically connected to the first initialization voltage line VL3, and when the sensing driving voltage Vcom is the second initialization voltage VINT2, the first electrode of the amplification transistor ST2 is electrically connected to the second initialization voltage line VL4.

The output transistor ST3 includes a first electrode connected to a second sensing node SN2, a second electrode connected to the d-th readout line RLd, and a third electrode that receives an output control signal. The output transistor ST3 transmits a detection signal FSd to the d-th readout line RLd in response to the output control signal. The output control signal is the j-th write scan signal SWj received through the j-th write scan line SWLj. For example, the output transistor ST3 receives the j-th write scan signal SWj from the write scan line SWLj as an output control signal.

The light detection unit LSU of the sensor FX is exposed to light during an emission period of the light emitting elements ED_R, ED_G1, ED_G2, and ED_B. The light is output from one of the light emitting elements ED_R, ED_G1, ED_G2, and ED_B.

If the user's hand (US_F, see FIG. 1) touches the display surface, the first and second light detection elements OPD1 and OPD2 generate photocharges that correspond to light reflected by ridges or valleys between the ridges of the fingerprint, and the generated photocharges accumulate in the first sensing node SN1.

The amplification transistor ST2 is a source follower amplifier that generates a source-drain current in proportion to the amount of charge of the first sensing node SN1 input to the third electrode.

A low level j-th write scan signal SWj is supplied to the output transistor ST3 through the j-th write scan line SWLj. When the output transistor ST3 is turned on in response to the low-level j-th write scan signal SWj, the detection signal FSd that corresponds to the current flowing through the amplification transistor ST2 is output to the d-th readout line RLd.

When a high level reset control signal RST is supplied through the reset control line RCL, the reset transistor ST1 is turned on. In an embodiment, the reset period is a high level activation period of the reset control line RCL. In an embodiment, when the reset transistor ST1 is a PMOS transistor, a low-level reset control signal RST is supplied to the reset control line RCL during the reset period. During the reset period, the first sensing node SN1 is reset to a potential that corresponds to the reset voltage Vrst. For example of the inventive concept, the reset voltage Vrst has a lower level than the second driving voltage ELVSS.

When the reset period ends, the light detection unit LSU generates photocharges that correspond to the received light, and the generated photocharges accumulate in the first sensing node SN1.

Figure 7:
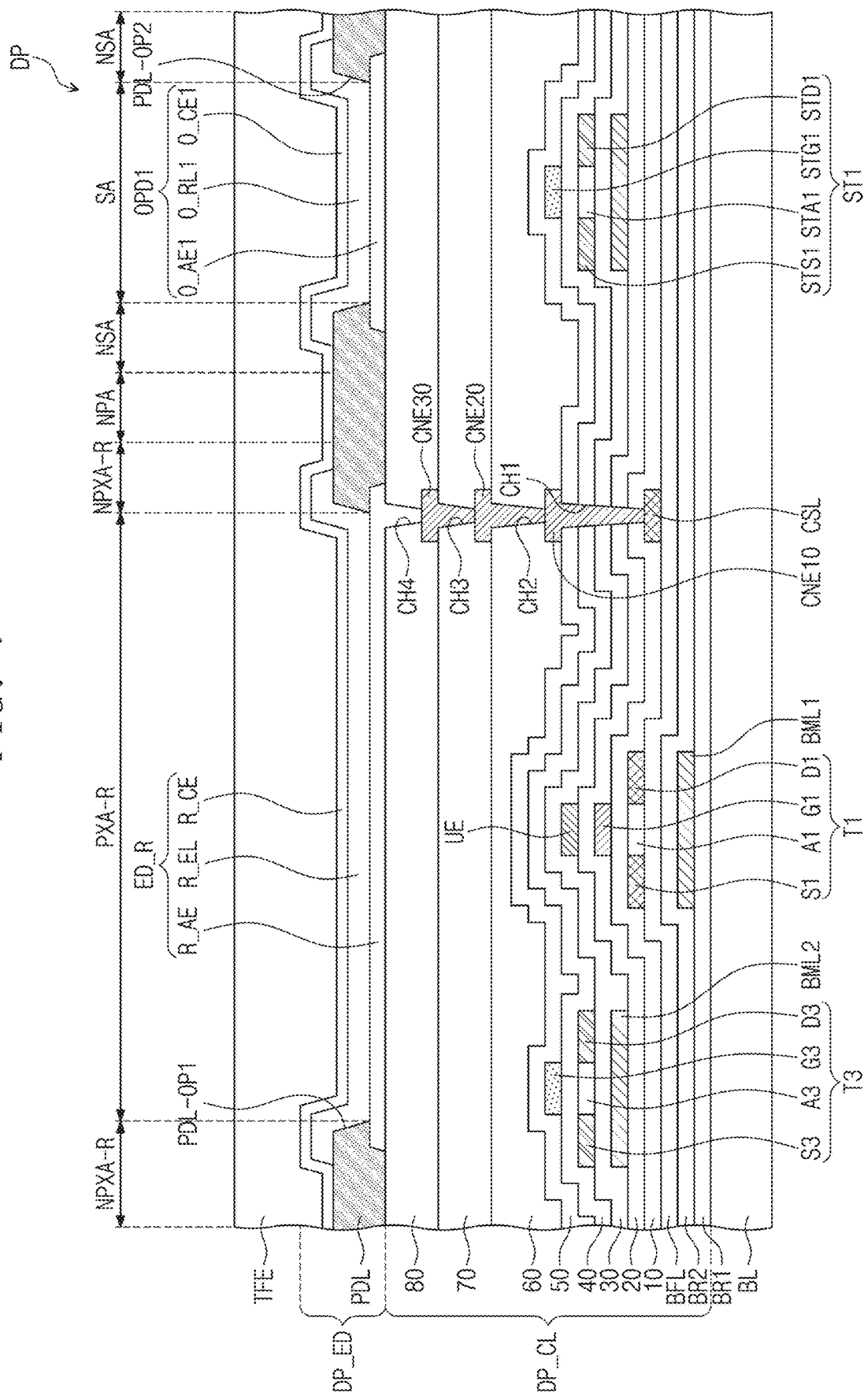
FIG. 7 is a cross-sectional view of a display panel according to an embodiment.
Figure 8A:
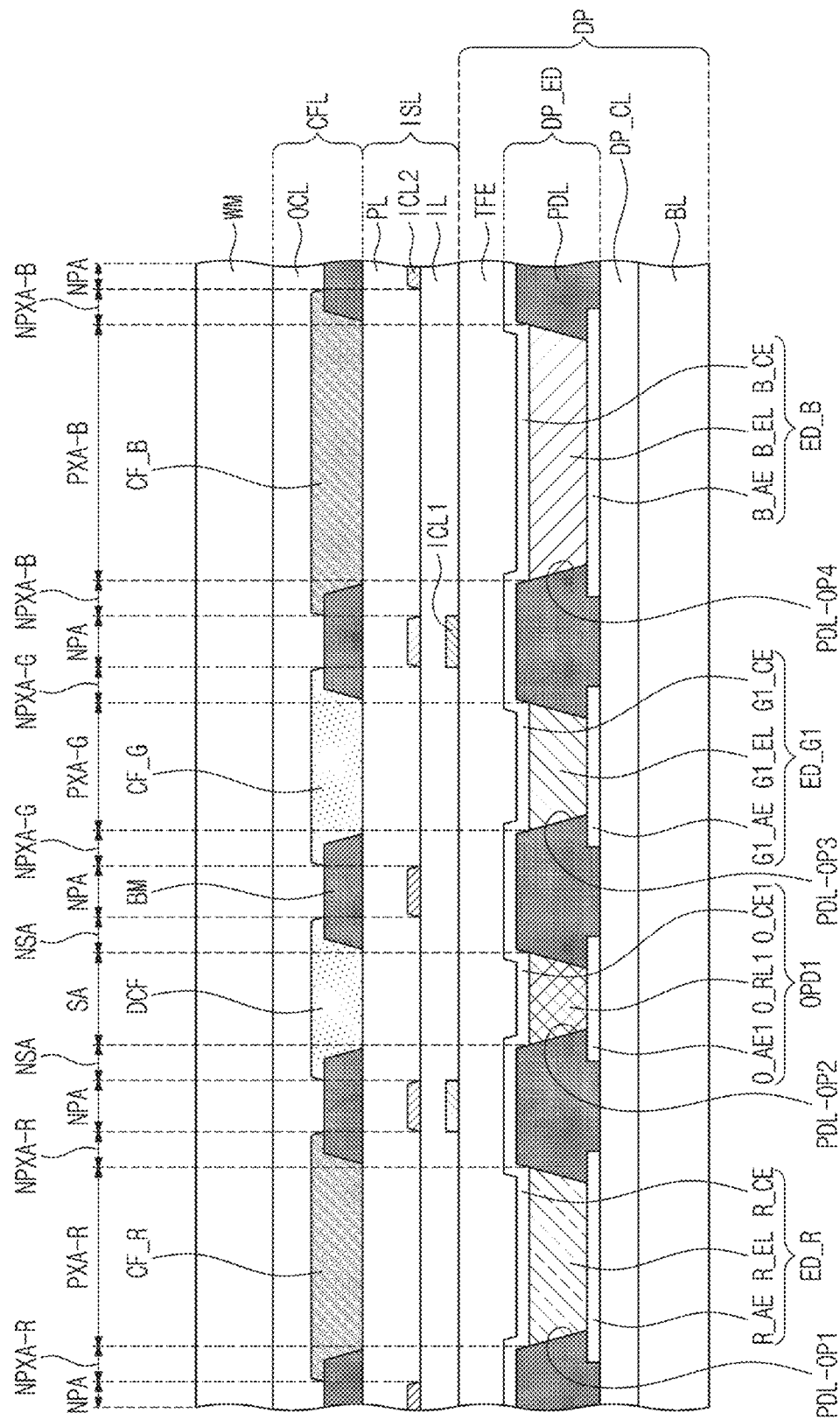
FIGS. 8A and 8B are cross-sectional views that illustrate a light emitting device and a light sensing device of a display panel according to an embodiment of the inventive concept.
Figure 8B:
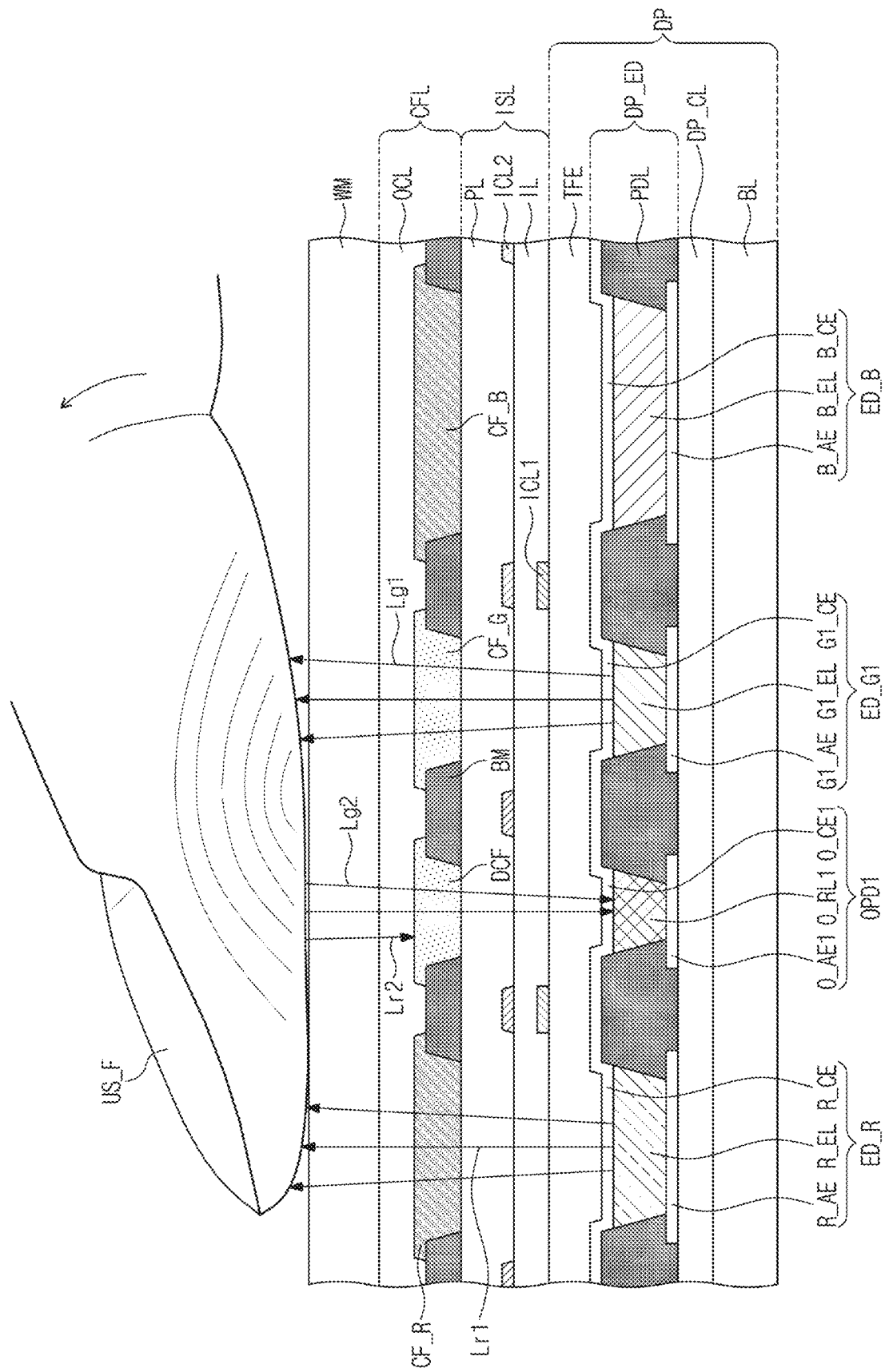

FIG. 7 is a cross-sectional view of a display panel DP according to an embodiment. FIGS. 8A and 8B are cross-sectional views of a light emitting element and a light detection element of a display panel according to an embodiment.

Referring to FIG. 7, in an embodiment, the display panel DP includes a base layer BL, a circuit layer DP_CL disposed on the base layer BL, an element layer DP_ED disposed on the circuit layer DP_CL, and an encapsulation layer TFE disposed on the element layer DP_ED.

The base layer BL includes a synthetic resin layer. The synthetic resin layer includes a thermosetting resin. For example, the synthetic resin layer is a polyimide resin layer, however. the material thereof is not necessarily limited. The synthetic resin layer includes at least one of acrylic resin, methacrylic resin, polyisoprene, vinyl resin, epoxy resin, urethane resin, cellulose resin, siloxane resin, polyamide resin, or perylene resin. In addition, the base layer BL may include a glass substrate, a metal substrate, or an organic/inorganic composite material substrate.

At least one inorganic layer is formed on the upper surface of the base layer BL. The inorganic layer includes at least one of aluminum oxide, titanium oxide, silicon oxide, silicon oxynitride, zirconium oxide, or hafnium oxide. The inorganic layer includes multiple layers. The multi-layered inorganic layers include barrier layers BR1 and BR2 and/or a buffer layer BFL, which will be described below. The barrier layers BR1 and BR2 and the buffer layer BFL may be selectively disposed.

The barrier layers BR1 and BR2 prevent external foreign substances from being introduced. The barrier layers BR1 and BR2 include a silicon oxide layer and a silicon nitride layer. Each of these includes a plurality of layers, and silicon oxide layers and silicon nitride layers are alternately stacked.

The barrier layers BR1 and BR2 include a first barrier layer BR1 and a second barrier layer BR2. In an embodiment, a first rear metal layer BML1 is disposed between the first barrier layer BR1 and the second barrier layer BR2. In an embodiment of the inventive concept, the first rear metal layer BML1 is omitted.

The buffer layer BFL is disposed on the barrier layers BR1 and BR2. The buffer layer BFL improves the bonding force between the base layer BL and the semiconductor pattern and/or the conductive pattern. The buffer layer BFL includes a silicon oxide layer and a silicon nitride layer. The silicon oxide layer and the silicon nitride layer are alternately stacked.

The first semiconductor pattern is disposed on the buffer layer BFL. The first semiconductor pattern includes a silicon semiconductor. For example, the silicon semiconductor includes at least one of amorphous silicon or polycrystalline silicon, etc. For example, the first semiconductor pattern includes low-temperature polysilicon.

FIG. 7 illustrates only a portion of the first semiconductor pattern disposed on the buffer layer BFL, and a first semiconductor pattern may be further disposed in another area. The first semiconductor pattern is arranged in a specific rule across the pixels. The first semiconductor pattern has different electrical properties depending on whether or not it is doped. The first semiconductor pattern includes a first area that has a high conductivity and a second area that has a low conductivity. The first area is doped with an N-type dopant or a P-type dopant. A P-type transistor includes a doping area doped with a P-type dopant, and an N-type transistor includes a doping area doped with an N-type dopant. The second area is a non-doped area or an area doped with a lower concentration than the first area.

The conductivity of the first area is greater than that of the second area, and the first area serves as an electrode or a signal line. The second area corresponds to an active area or a channel of the transistor. For example, a part of the semiconductor pattern is an active area of the transistor, another part is a source or drain of the transistor, and another part is a connection electrode or a connection signal line.

The first electrode S1, the channel part A1, and the second electrode D1 of the first transistor T1 are formed from the first semiconductor pattern. The first electrode S1 and the second electrode D1 of the first transistor T1 extend in opposite directions from the channel part A1.

FIG. 7 illustrates a portion of the connection signal line CSL formed from the first semiconductor pattern. The connection signal line CSL is connected to the second electrode of the fifth transistor T5 (see FIG. 6) in a plan view.

A first insulating layer 10 is disposed on the buffer layer BFL. The first insulating layer 10 overlaps the plurality of pixels in common. The first insulating layer 10 may be an inorganic layer and/or an organic layer, and may have a single layer or a multilayer structure. The first insulating layer 10 includes at least one of aluminum oxide, titanium oxide, silicon oxide, silicon nitride, silicon oxynitride, zirconium oxide, or hafnium oxide. In an embodiment, the first insulating layer 10 is a single-layer silicon oxide layer. In addition to the first insulating layer 10, the insulating layer of the circuit layer DP_CL to be described below may be an inorganic layer and/or an organic layer, and may have a single layer or multilayer structure. The inorganic layer includes at least one of the above-mentioned materials, but is necessarily not limited thereto.

The third electrode G1 of the first transistor T1 is disposed on the first insulating layer 10. The third electrode G1 is a part of a metal pattern. The third electrode G1 of the first transistor T1 overlaps the channel part A1 of the first transistor T1. In the process of doping the first semiconductor pattern, the third electrode G1 of the first transistor T1 functions as a mask. The third electrode G1 includes at least one of titanium (Ti), silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), indium tin oxide (ITO), or indium zinc oxide (IZO), etc., but embodiments of the inventive concept are not necessarily limited thereto.

A second insulating layer 20 is disposed on the first insulating layer 10 and covers the third electrode G1 of the first transistor T1. The second insulating layer 20 may be an inorganic layer and/or an organic layer, and may have a single layer or multilayer structure. The second insulating layer 20 includes at least one of silicon oxide, silicon nitride, or silicon oxynitride. In an embodiment, the second insulating layer 20 has a multilayer structure that includes a silicon oxide layer and a silicon nitride layer.

An upper electrode UE and a second rear metal layer BML2 are disposed on the second insulating layer 20. The upper electrode UE overlaps the third electrode G1. The upper electrode UE is a part of a metal pattern. A portion of the third electrode G1 and the upper electrode UE that overlap each other form a capacitor Cst (see FIG. 6). In an embodiment of the inventive concept, the second insulating layer 20 is replaced with an insulating pattern. For example, the upper electrode UE is disposed on the insulating pattern, and the upper electrode UE serves as a mask for forming the insulating pattern from the second insulating layer 20.

The second rear metal layer BML2 is disposed under the lower portion of the oxide thin film transistor, such as the third transistor T3. The second rear metal layer BML2 receives a constant voltage or a signal.

A third insulating layer 30 is disposed on the second insulating layer 20 and covers the upper electrode UE and the second rear metal layer BML2. The third insulating layer 30 has a single layer or a multilayer structure. For example, the third insulating layer 30 has a multilayer structure that includes a silicon oxide layer and a silicon nitride layer.

The second semiconductor pattern is disposed on the third insulating layer 30. The second semiconductor pattern includes an oxide semiconductor. The oxide semiconductor includes a plurality of areas that are divided based on whether or not the metal oxide is reduced. An area in which the metal oxide is reduced, hereinafter referred to as a reduced area, has greater conductivity than an area in which the metal oxide is not reduced, hereinafter referred to as a non-reduced area. The reduced area serves as the source/drain or signal line of the transistor. The non-reduced area corresponds to the active area or channel of the transistor. For example, a portion of the second semiconductor pattern is an active area of the transistor, another portion is a source/drain area of the transistor, and another portion is a signal transmission area.

The first electrode S3, the channel part A3, and the second electrode D3 of the third transistor T3 are formed from the second semiconductor pattern. The first electrode S3 and the second electrode D3 include metal reduced from the metal oxide semiconductor. The first electrode S3 and the second electrode D3 extend in opposite directions from the channel part A3 in a cross-sectional view.

A fourth insulating layer 40 is disposed on the third insulating layer 30. The fourth insulating layer 40 overlaps the plurality of pixels in common and covers the second semiconductor pattern. The fourth insulating layer 40 includes at least one of aluminum oxide, titanium oxide, silicon oxide, silicon nitride, silicon oxynitride, zirconium oxide, or hafnium oxide.

The third electrode G3 of the third transistor T3 is disposed on the fourth insulating layer 40. The third electrode G3 is a part of a metal pattern. The third electrode G3 of the third transistor T3 overlaps the channel part A3 of the third transistor T3. In a process of doping the second semiconductor pattern, the third electrode G3 functions as a mask. In an embodiment of the inventive concept, the fourth insulating layer 40 is replaced with an insulating pattern.

A fifth insulating layer 50 is disposed on the fourth insulating layer 40 and covers the third electrode G3. The fifth insulating layer 50 is an inorganic layer.

A first connection electrode CNE10 is disposed on the fifth insulating layer 50. The first connection electrode CNE10 is connected to the connection signal line CSL through a first contact hole CH1 that penetrates through the first to fifth insulating layers 10, 20, 30, 40, and 50.

A sixth insulating layer 60 is disposed on the fifth insulating layer 50. The sixth insulating layer 60 is an organic layer. The organic layer includes at least one of benzocyclobutene (BCB), polyimide, hexamethyldisiloxane (HMDSO), polymethylmethacrylate (PMMA), or general purpose polymers such as polystyrene (PS), polymer derivatives that include phenolic groups, acrylic polymers, imide-based polymers, arylether-based polymers, amide-based polymers, fluorine-based polymers, p-xylene-based polymers, vinyl alcohol-based polymers, or blends thereof, etc., but embodiments of the inventive concept are not necessarily limited thereto.

A second connection electrode CNE20 is disposed on the sixth insulating layer 60. The second connection electrode CNE20 is connected to the first connection electrode CNE10 through a second contact hole CH2 that penetrates through the sixth insulating layer 60. A seventh insulating layer 70 is disposed on the sixth insulating layer 60 and covers the second connection electrode CNE20. The seventh insulating layer 70 is an organic layer.

A third connection electrode CNE30 is disposed on the seventh insulating layer 70. The third connection electrode CNE30 is connected to the second connection electrode CNE20 through a third contact hole CH3 that penetrates through the seventh insulating layer 70. An eighth insulating layer 80 is disposed on the seventh insulating layer 70 and covers the third connection electrode CNE30. The eighth insulating layer 80 is an organic layer.

A first electrode layer is disposed on the circuit layer DP_CL. A pixel defining film PDL is formed on the first electrode layer. The first electrode layer includes red, green, and blue anodes R_AE, G_AE1, and B_AE and a first anode O_AE1. The red, green, and blue anodes R_AE, G_AE1 and B_AE and the first anode O_AE1 are disposed on the eighth insulating layer 80. The red anode R_AE is connected to the third connection electrode CNE30 through a fourth contact hole CH4 that penetrates through the eighth insulating layer 80.

The first to fourth openings PDL-OP1, PDL-OP2, PDL-OP3, PDL-OP4 of the pixel defining film PDL expose at least a portion of the red anode R_AE, the first anode O_AE1, the green anode G_AE1, and the blue anode B_A3, respectively. In an embodiment of the inventive concept, the pixel defining film PDL further includes a black material. For example, the pixel defining film PDL further includes a black organic dye/pigment such as carbon black or aniline black. The pixel defining film PDL is formed by mixing a blue organic material and a black organic material. The pixel defining film PDL further includes a liquid-repellent organic material.

As shown in FIG. 8A, in an embodiment, the display panel DP includes first to third emission areas PXA-R, PXA-G, and PXA-B and first to third non-emission areas NPXA-R, NPXA-G, and NPXA-B adjacent to the first to third emission areas PXA-R, PXA-G, and PXA-B. The non-emission areas NPXA-R, NPXA-G, and NPXA-B enclose corresponding emission areas PXA-R, PXA-G, and PXA-B. In an embodiment, the first emission area PXA-R corresponds to a partial area of the red anode R_AE exposed by the first opening PDL-OP1. The second emission area PXA-G corresponds to a partial area of the first green anode G1_AE exposed by the third opening PDL-OP3. The third emission area PXA-B corresponds to a partial area of the blue anode B_AE exposed by the fourth opening PDL-OP4.

A non-pixel area NPA is formed between the first to third non-emission areas NPXA-R, NPXA-G, and NPXA-B.

A light emitting layer is disposed on the first electrode layer. The light emitting layer includes red, green, and blue light emitting layers R_EL, G1_EL, and B_EL. The red, green, and blue light emitting layers R_EL, G1_EL, and B_EL are disposed in areas that correspond to the first, third, and fourth openings PDL-OP1, PDL-OP3, and PDL-OP4, respectively. The red, green, and blue light emitting layers R_EL, G1_EL, and B_EL are separately formed in the red, green, and blue pixels PXR, PXG1, PXB (see FIG. 4A), respectively. Each of the red, green, and blue light emitting layers R_EL, G1_EL, and B_EL includes an organic material and/or an inorganic material. The red, green, and blue light emitting layers R_EL, G1_EL, and B_EL each generate a predetermined color of light. For example, the red light emitting layer R_EL generates red light, the green light emitting layer G1_EL generates green light, and the blue light emitting layer B_EL generates blue light.

Although the patterned red, green and blue light emitting layers R_EL, G1_EL, and B_EL are illustrated as an embodiment, in an embodiment, one light emitting layer is commonly disposed in the first to third emission areas PXA-R, PXA-G, and PXA-B. For example, the light emitting layer generates white light or blue light. In addition, the light emitting layer has a multi-layered structure called tandem.

Each of the red, green, and blue light emitting layers R_EL, G1_EL, and B_EL includes an organic material as a light emitting material. However, in an embodiment, each of the red, green, and blue light emitting layers R_EL, G1_EL, and B_EL includes a quantum dot material as a light emitting material. The core of the quantum dot is one of a group II-VI compound, a group III-V compound, a group IV-VI compound, a group IV element, a group IV compound, or combinations thereof.

A second electrode layer is disposed on the light emitting layer. The second electrode layer includes red, green, and blue cathodes R_CE, G1_CE, and B_CE. The red, green, and blue cathodes R_CE, G1_CE, and B_CE are electrically connected to each other. For example, the red, green, and blue cathodes R_CE, G1_CE, and B_CE are integrally formed with each other. For example, the red, green, and blue cathodes R_CE, G1_CE, and B_CE are commonly disposed in the first to third emission areas PXA-R, PXA-G, and PXA-B, the first to third non-emission areas NPXA-R, NPXA-G, and NPXA-B, and the non-pixel area NPA.

The circuit layer DP_CL further includes a sensor driving circuit O_SD (see FIG. 6). Referring to FIG. 7, and for convenience of description, the reset transistor ST1 of the sensor driving circuit O_SD is illustrated. The first electrode STS1, the channel part STA1, and the second electrode STD1 of the reset transistor ST1 are formed from the second semiconductor pattern. The first electrode STS1 and the second electrode STD1 include metal reduced from the metal oxide semiconductor. The fourth insulating layer 40 covers the first electrode STS1, the channel part STA1, and the second electrode STD1 of the reset transistor ST1. The third electrode STG1 of the reset transistor ST1 is disposed on the fourth insulating layer 40. In an embodiment, the third electrode STG1 is a part of a metal pattern. The third electrode STG1 of the reset transistor ST1 overlaps the channel part STA1 of the reset transistor ST1.

For example, the reset transistor ST1 is disposed on the same layer as the third transistor T3. For example, the first electrode STS1, the channel part STA1, and the second electrode STD1 of the reset transistor ST1 are formed through the same process as that of the first electrode S3, the channel part A3, and the second electrode D3 of the third transistor T3. The third electrode STG1 of the reset transistor ST1 is simultaneously formed with the third electrode G3 of the third transistor T3 through the same process. In addition, the first and second electrodes of the amplification transistor ST2 and the output transistor ST3 of the sensor driving circuit O_SD are formed through the same process as the first electrode S1 and the second electrode D1 of the first transistor T1. The reset transistor ST1 and the third transistor T3 are formed on the same layer through the same process. Since an additional process is not needed to form the reset transistor ST1, process efficiency and cost are reduced.

The element layer DP_ED further includes first and second light detection elements OPD1 and OPD2 (see FIG. 6). For convenience of illustration, FIGS. 7, 8A, and 8B show only the first light detection element OPD1.

The first light detection element OPD1 includes a first anode O_AE1, a first photoelectric conversion layer O_RL1, and a first cathode O_CE1. The first anode O_AE1 is disposed on the same layer as the first electrode layer. For example the first anode O_AE1 is disposed on the circuit layer DP_CL and is simultaneously formed through the same process as the red, green, and blue anodes R_AE, G1_AE, and B_AE. For example the first anode O_AE1 is disposed on the eighth insulation layer 80.

The second opening PDL-OP2 of the pixel defining film PDL exposes at least a portion of the first anode O_AE1. The first photoelectric conversion layer O_RL1 is disposed on the portion of the first anode O_AE1 that is exposed by the second opening PDL-OP2. The first photoelectric conversion layer O_RL1 includes an organic photo-sensing material. The first cathode O_CE1 is disposed on the first photoelectric conversion layer O_RL1. The first cathode O_CE1 is simultaneously formed through the same process as the red, green, and blue cathodes R_CE, G1_CE, and B_CE. For example, the first cathode O_CE1 is integrally formed with the red, green, and blue cathodes R_CE, G1_CE, and B_CE.

Each of the first anode O_AE1 and the first cathode O_CE1 receives an electrical signal. The first cathode O_CE1 receives a signal that differs from that of the first anode O_AE1. Accordingly, a predetermined electric field is formed between the first anode O_AE1 and the first cathode O_CE1. The first photoelectric conversion layer O_RL1 generates an electrical signal that corresponds to light incident on the sensor. The first photoelectric conversion layer O_RL1 absorbs energy of the incident light and generates an electric charge. For example, the first photoelectric conversion layer O_RL1 includes a light-sensitive semiconductor material.

The electric charge generated in the first photoelectric conversion layer O_RL1 changes the electric field between the first anode O_AE1 and the first cathode O_CE1. The amount of charge generated in the first photoelectric conversion layer O_RL1 varies depending on whether light is incident on the first light detection element OPD1, the amount of light incident on the first light detection element OPD1, and the intensity. Accordingly, an electric field formed between the first anode O_AE1 and the first cathode O_CE1 can vary. The first light detection element OPD1 according to an embodiment of the inventive concept acquires a user's fingerprint information through a change in the electric field between the first anode O_AE1 and the first cathode O_CE1.

However, embodiments are not necessarily limited thereto, and in an embodiment, the first light detection element OPD1 includes a phototransistor that includes the first photoelectric conversion layer O_RL1 as an active layer. For example, the first light detection element OPD1 acquires fingerprint information by detecting an amount of current flowing through the phototransistor. The first light detection element OPD1 according to an embodiment of the inventive concept includes various photoelectric conversion elements that can generate an electrical signal in response to a change in the amount of light, but is not necessarily limited to any one embodiment.

An encapsulation layer TFE is disposed on the element layer DP_ED. The encapsulation layer TFE includes at least an inorganic layer or an organic layer. In an embodiment of the inventive concept, the encapsulation layer TFE includes two inorganic layers and an organic layer disposed therebetween. In an embodiment of the inventive concept, the thin film encapsulation layer includes a plurality of inorganic layers and a plurality of organic layers that are alternately stacked.

The inorganic encapsulation layer protects the red, green and blue light emitting elements ED_R, ED_G1, and ED_B and the first light detection element OPD1 from moisture/oxygen, and the organic encapsulation layer protects the red, green and blue light emitting elements ED_R, ED_G1, ED_B and the first light detection element OPD1 from foreign substances such as dust particles. The inorganic encapsulation layer includes at least one of a silicon nitride layer, a silicon oxynitride layer, a silicon oxide layer, a titanium oxide layer, or an aluminum oxide layer, but embodiments of the inventive concept are not necessarily limited thereto. The organic encapsulation layer includes an acryl-based organic layer, but is not necessarily limited.

Referring now to FIGS. 8A and 8B, in an embodiment, the display device DD includes an input detection layer ISL disposed on the display panel DP and an anti-reflection layer CFL disposed on the input detection layer ISL.

The input detection layer ISL is directly disposed on the encapsulation layer TFE. The input detection layer ISL includes a first conductive layer ICL1, an insulating layer IL, a second conductive layer ICL2, and a protective layer PL. The first conductive layer ICL1 is disposed on the encapsulation layer TFE. FIGS. 8A and 8B illustrate a structure in which the first conductive layer ICL1 is directly disposed on the encapsulation layer TFE, but embodiments of the inventive concept are not necessarily limited thereto. In an embodiment, the input detection layer ISL further includes a base insulating layer disposed between the first conductive layer ICL1 and the encapsulation layer TFE. For example, the encapsulation layer TFE is covered by the base insulating layer, and the first conductive layer ICL1 is disposed on the base insulating layer. For example, the base insulating layer includes an inorganic insulating material.

The insulating layer IL is directly disposed on the encapsulation layer TFE and covers the first conductive layer ICL1. The second conductive layer ICL2 is disposed on the insulating layer IL. Although a structure in which the input detection layer ISL includes the first and second conductive layers ICL1 and ICL2 is illustrated, embodiments of the inventive concept are not necessarily limited thereto. For example, in an embodiment, the input detection layer ISL includes only one of the first and second conductive layers ICL1 and ICL2.

The protective layer PL is disposed on insulating layer IL and covers the second conductive layer ICL2. The protective layer PL includes an organic insulating material. The protective layer PL protects the first and second conductive layers ICL1 and ICL2 from moisture/oxygen, and protects the first and second conductive layers ICL1 and ICL2 from foreign sub stances.

The anti-reflection layer CFL is disposed on the input detection layer ISL. The anti-reflection layer CFL is directly disposed on the protective layer PL. The anti-reflection layer CFL includes a first color filter CF_R, a second color filter CF_G, and a third color filter CF_B. The first color filter CF_R has a first color, the second color filter CF_G has a second color, and the third color filter CF_B has a third color. For example, the first color is red, the second color is green, and the third color is blue.

The anti-reflection layer CFL further includes a dummy color filter DCF. For example, when an area in which the first photoelectric conversion layer O_RL1 is disposed forms a sensing area SA, and a periphery of the sensing area SA forms a non-sensing area NSA, the dummy color filter DCF is disposed in the sensing area SA. The dummy color filter DCF overlaps the sensing area SA and the non-sensing area NSA. For example, the dummy color filter DCF has the same color as one of the first to third color filters CF_R, CF_G, and CF_B. For example, the dummy color filter DCF has the same green color as the second color filter CF_G.

The anti-reflection layer CFL further includes a black matrix BM. The black matrix BM is disposed in the non-pixel area NPA. The black matrix BM overlaps the first and second conductive layers ICL1 and ICL2 in the non-pixel area NPA. For example, the black matrix BM overlaps the non-pixel area NPA and the first to third non-emission areas NPXA-G, NPXA-B, and NPXA-R. The black matrix BM does not overlap the first to third emission areas PXA-R, PXR-G, and PXA-B.

The anti-reflection layer CFL further includes an overcoat layer OCL. The overcoat layer OCL includes an organic insulating material. The overcoat layer OCL has a thickness sufficient to remove step differences between the first to third color filters CF_R, CF_G, and CF_B. The overcoat layer OCL is not particularly limited as long as it has a sufficient thickness and includes a material that can planarize the upper surface of the anti-reflection layer CFL, and includes, for example, an acrylate-based organic material.

Referring to FIG. 8B, in an embodiment, when the display device DD (see FIG. 1) operates, each of the red, green, and blue light emitting elements ED_R, ED_G1, and ED_B outputs light. The red light emitting elements ED_R output red light in a red wavelength band, the green light emitting elements ED_G1 output green light in a green wavelength band, and the blue light emitting elements ED_B output blue light in a blue wavelength band.

For example, the first light detection element OPD1 receives light from specific light emitting elements, such as the green light emitting elements ED_G1. For example, the first light detection element OPD1 receives the green light Lg2 that is reflected by the user's fingerprint from the green light Lg1 output from the green light emitting elements ED_G1. A dummy color filter DCF is disposed on the first light detection element OPD1. The dummy color filter DCF has a green color. Accordingly, the green reflected light Lg2 passes through the dummy color filter DCF and is incident on the first light detection element OPD1.

Meanwhile, the red and blue light output from the red and blue light emitting elements ED_R and ED_B are also reflected by the user's hand US_F. For example, the red light Lr1 output from the red light emitting elements ED_R is reflected by the user's hand US_F and becomes the red reflected light Lr2. The red reflected light Lr2 is absorbed without passing through the dummy color filter DCF.

Accordingly, the red reflected light Lr2 does not pass through the dummy color filter DCF and cannot be incident on the first light detection element OPD1. Similarly, even if blue light is reflected by the user's hand US_F, it is absorbed by the dummy color filter DCF. Accordingly, only the green reflected light Lg2 is provided to the first light detection element OPD1.

Figure 9:
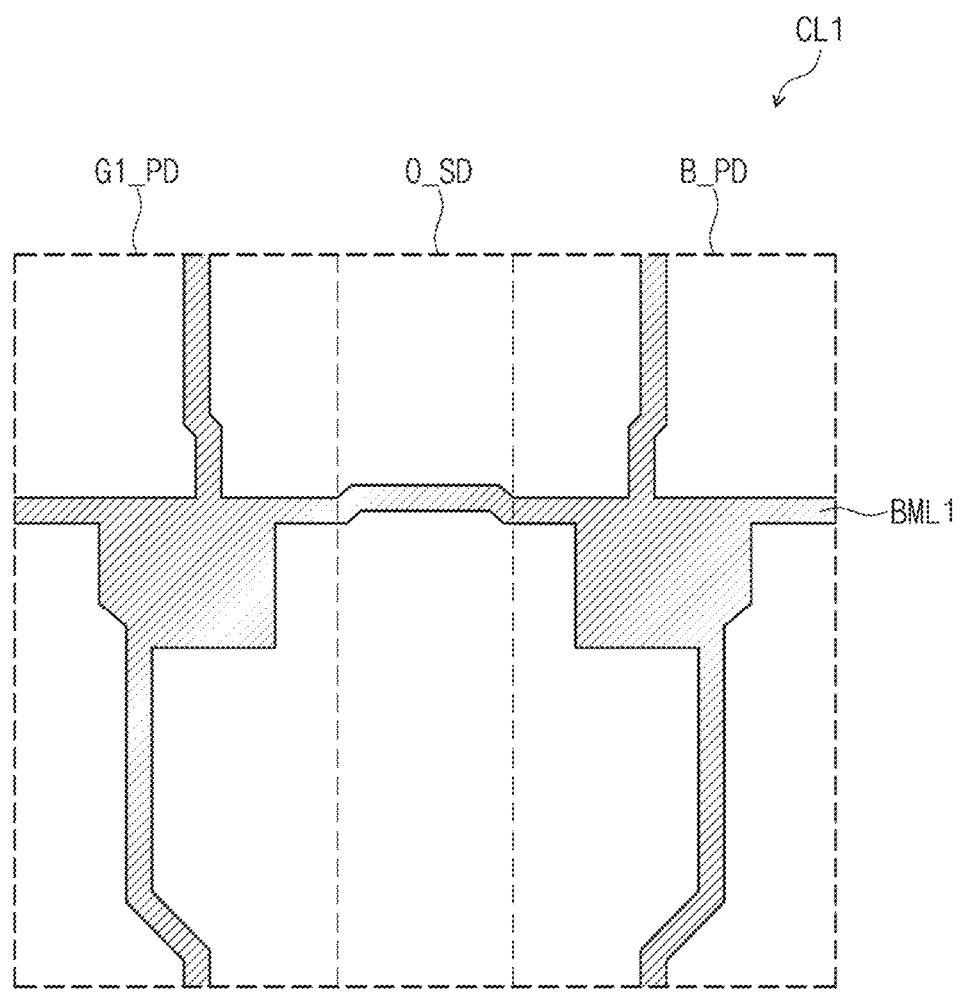
FIG. 9 is a plan view of one layer of a pixel driving circuit and a sensor driving circuit according to an embodiment of the inventive concept.

FIG. 9 is a plan view of a layer CL1 of a pixel driving circuit and a sensor driving circuit according to an embodiment of the inventive concept.

Referring to FIGS. 4A and 9, in an embodiment, areas that correspond to the first green pixel driving circuit G1_PD, hereinafter referred to as the first pixel driving circuit, the sensor driving circuit O_SD, and the blue pixel driving circuit B_PD, hereinafter referred to as the second pixel driving circuit, are shown in FIG. 9. The first pixel driving circuit G1_PD, the sensor driving circuit O_SD, and the second pixel driving circuit B_PD are arranged in the second direction DR2. The first pixel driving circuit G1_PD and the second pixel driving circuit B_PD have a substantially symmetrical structure.

Referring to FIGS. 7 and 9, in an embodiment, the hatched first layer CL1 is illustrated. The first layer CL1 is a first rear metal layer BML1 disposed between the first barrier layer BR1 and the second barrier layer BR2. The first rear metal layer BML1 is disposed in at least a partial area of the first pixel driving circuit G1_PD and the second pixel driving circuit B_PD. In an embodiment, the first rear metal layer BML1 overlaps the first transistor T1.

The first rear metal layer BML1 blocks an electric potential caused by polarization of the base layer BL from affecting the first pixel driving circuit G1_PD and the second pixel driving circuit B_PD.

The first rear metal layer BML1 is connected to an electrode or a line and receives a constant voltage or a signal therefrom. In an embodiment, the first rear metal layer BML1 is isolated from other electrodes or lines.

The first rear metal layer BML1 includes a reflective metal. For example, the first rear metal layer BML1 includes at least one of silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), titanium (Ti), or p+ doped amorphous silicon.

Figure 10:
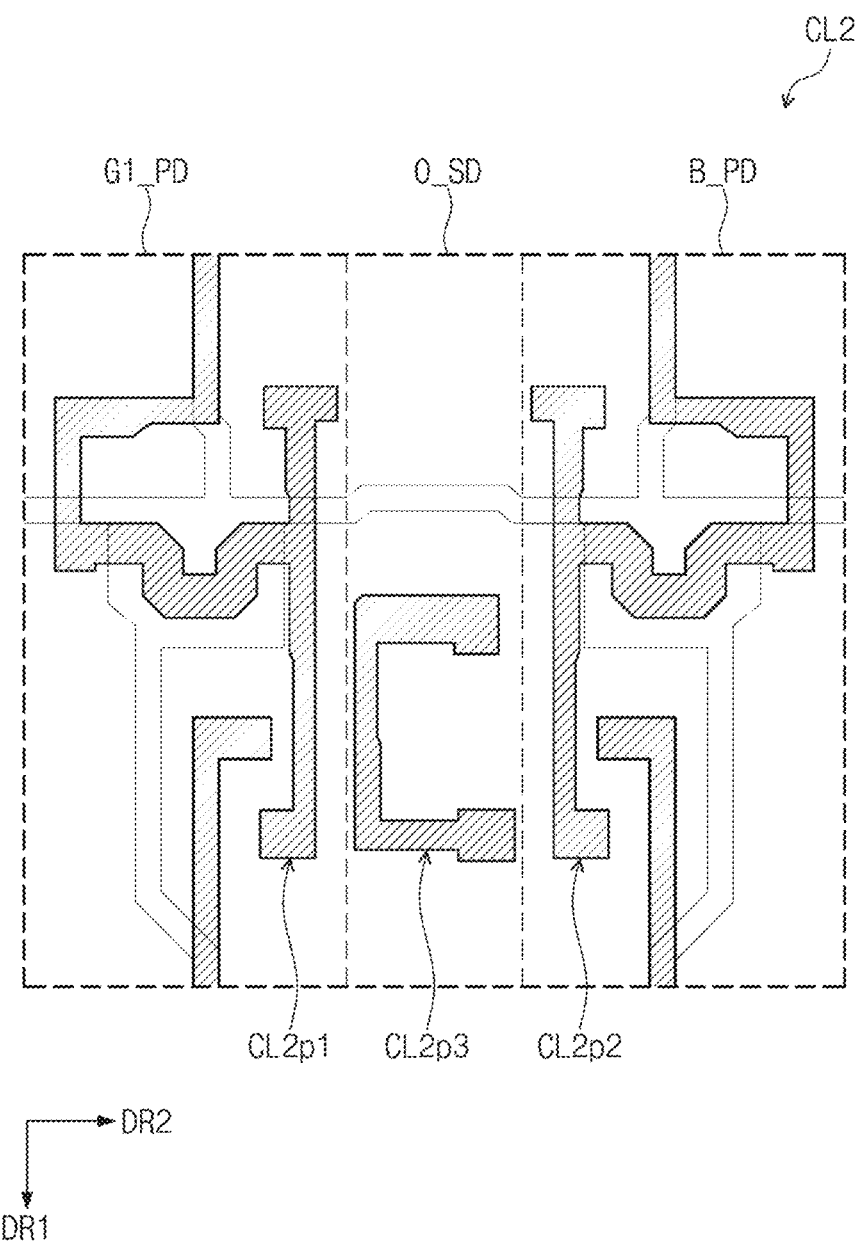
FIG. 10 is a plan view of one layer of a pixel driving circuit and a sensor driving circuit according to an embodiment of the inventive concept.

FIG. 10 is a plan view of a layer CL2 of a pixel driving circuit and a sensor driving circuit according to an embodiment of the inventive concept. The hatched second layer CL2 is illustrated in FIG. 10.

Referring to FIGS. 7 and 10, in an embodiment, the second layer CL2 is a first semiconductor pattern layer disposed between the buffer layer BFL and the first insulating layer 10. The second layer CL2 includes a first semiconductor portion CL2p1, a second semiconductor portion CL2p2, and a third semiconductor portion CL2p3. The first semiconductor portion CL2p1, the second semiconductor portion CL2p2, and the third semiconductor portion CL2p3 each include a silicon semiconductor. For example, the silicon semiconductor is at least one of amorphous silicon or polycrystalline silicon, etc. For example, the first semiconductor portion CL2p1, the second semiconductor portion CL2p2, and the third semiconductor portion CL2p3 each include low-temperature polysilicon (LTPS).

Figure 11:
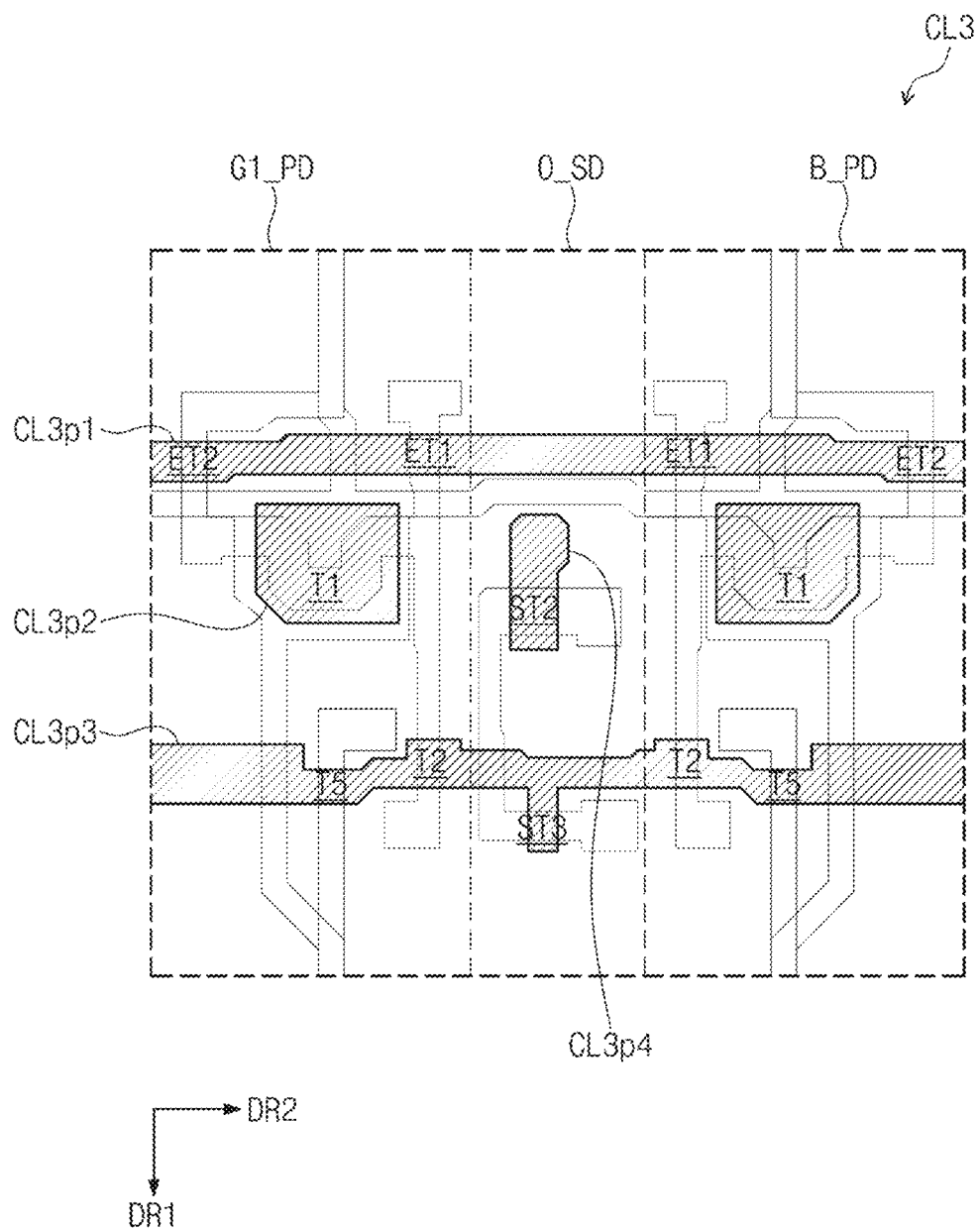
FIG. 11 is a plan view of one layer of a pixel driving circuit and a sensor driving circuit according to an embodiment of the inventive concept.

FIG. 11 is a plan view of a layer of a pixel driving circuit and a sensor driving circuit according to an embodiment of the inventive concept. A hatched third layer CL3 is illustrated in FIG. 11.

Referring to FIGS. 6, 7, and 11, in an embodiment, the third layer CL3 is a first conductive layer disposed between the first insulating layer 10 and the second insulating layer 20. The third layer CL3 includes at least one of a metal, an alloy, a conductive metal oxide, or a transparent conductive material. For example, the third layer CL3 includes at least one of titanium (Ti), silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), indium tin oxide (ITO), or indium zinc oxide (IZO), etc., but is not necessarily limited thereto.

The third layer CL3 includes a first line CL3p1, a first electrode CL3p2, a second line CL3p3, and a second electrode CL3p4.

The first line CL3p1 extends in the second direction DR2. The first line CL3p1 corresponds to the emission control line EMLj of FIG. 6. The first line CL3p1 forms the first and second emission control transistors ET1 and ET2 together with the first semiconductor portion CL2p1 and the second semiconductor portion CL2p2 illustrated in FIG. 10. For example, the j-th emission control signal EMj is provided through the first line CL3p1.

The first electrode CL3p2 has an island shape. The first electrode CL3p2 forms the first transistor T1 together with the first semiconductor portion CL2p1 and the second semiconductor portion CL2p2 illustrated in FIG. 10. The first electrode CL3p2 corresponds to the third electrode G1 of the first transistor T1.

The second line CL3p3 extends in the second direction DR2 and corresponds to the j-th write scan line SWLj. The second line CL3p3 forms the second transistor T2 together with the first semiconductor portion CL2p1 and the second semiconductor portion CL2p2 illustrated in FIG. 10. For example, the j-th write scan signal SWj (see FIG. 6) is provided to the second line CL3p3. The second line CL3p3 forms the output transistor ST3 together with the second semiconductor portion CL2p2 shown in FIG. 10.

The j-th write scan line SWLj corresponds to the (j+1)-th black scan line SBLj+1 or the (j−1)-th black scan line SBLj−1. Accordingly, the second line CL3p3 forms the fifth transistor T5 together with the first semiconductor portion CL2p1 and the second semiconductor portion CL2p2 illustrated in FIG. 10.

The second electrode CL3p4 has an island shape. The second electrode CL3p4 forms the amplification transistor ST2 together with the second semiconductor portion CL2p2 shown in FIG. 10.

Figure 12:
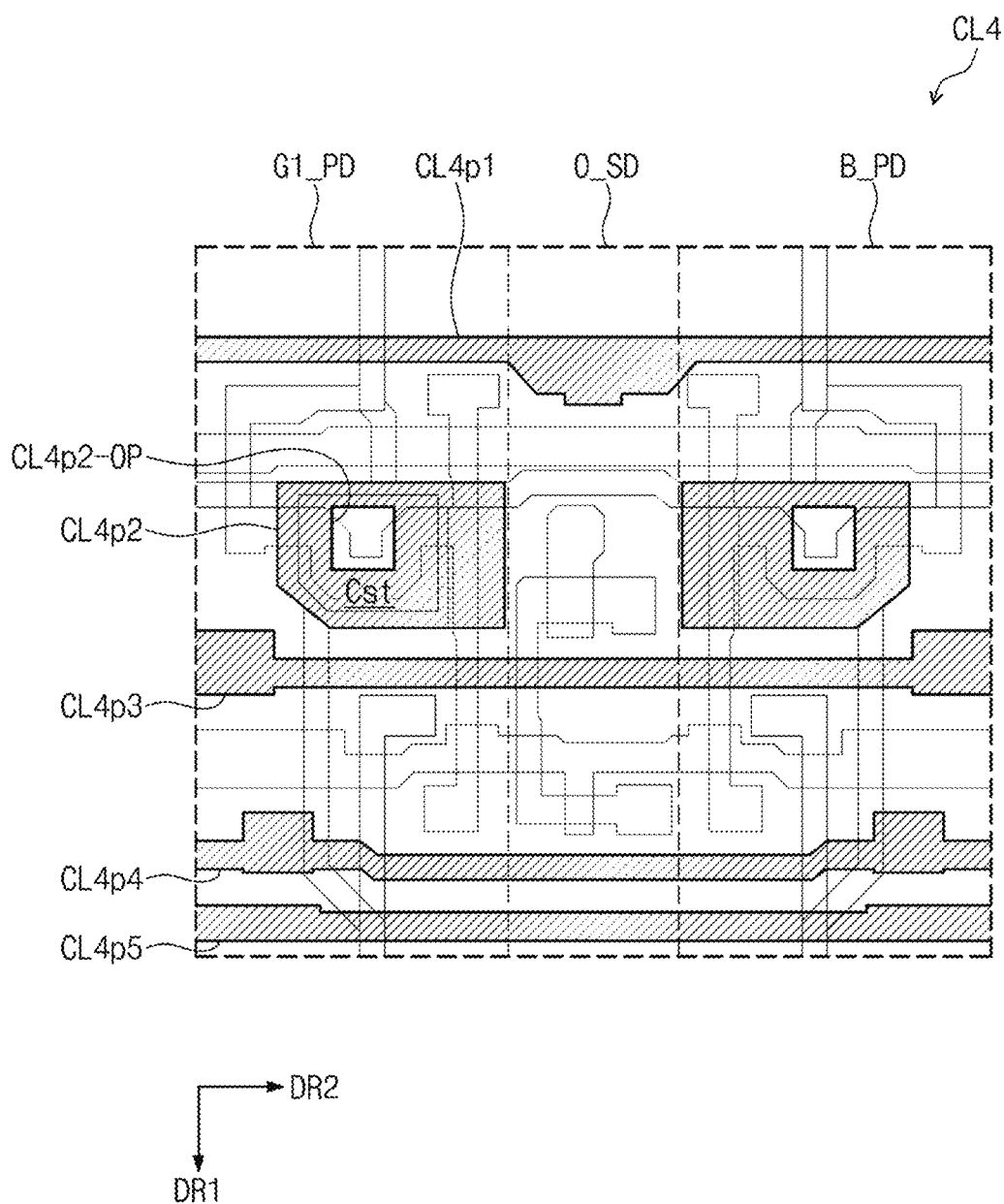
FIG. 12 is a plan view of one layer of a pixel driving circuit and a sensor driving circuit according to an embodiment of the inventive concept.

FIG. 12 is a plan view of a layer CL4 of a pixel driving circuit and a sensor driving circuit according to an embodiment of the inventive concept. The hatched fourth layer CL4 is illustrated in FIG. 12.

Referring to FIGS. 6, 7 and 12, in an embodiment, the fourth layer CL4 is a second conductive layer disposed between the second insulating layer 20 and the third insulating layer 30.

The fourth layer CL4 includes a third line CL4p1, a third electrode CL4p2, a fourth line CL4p3, a fifth line CL4p4, and a sixth line CL4p5.

The third line CL4p1 extends in the second direction DR2, and is a dummy line that overlaps the reset control line RCL. The fourth line CL4p3 is a dummy line that extends in the second direction DR2 and overlaps the compensation scan line SCLj. The fifth line CL4p4 is a dummy line that extends in the second direction DR2 and overlaps the initialization scan line SILj.

The third line CL4p1, the fourth line CL4p3, and the fifth line CL4p4 correspond to the second rear metal layer BML2. Accordingly, the third line CL4p1, the fourth line CL4p3, and the fifth line CL4p4 electrically float, receive a constant voltage, or receive a signal. For example, when receiving a signal, the third line CL4p1 receives a reset control signal RST, the fourth line CL4p3 receives the compensation scan signal SCj, and the fifth line CL4p4 receives the initialization scan signal SIj.

The sixth line CL4p5 extends in the second direction DR2 and corresponds to the first initialization voltage line VL3. The first initialization voltage VINT1 is provided through the sixth line CL4p5.

The third electrode CL4p2 overlaps the first electrode CL3p2 (see FIG. 11). For example, the third electrode CL4p2 forms the capacitor Cst together with the first electrode CL3p2. The third electrode CL4p2 corresponds to the upper electrode UE. The first driving voltage ELVDD is provided to the third electrode CL4p2. In addition, an opening CL4p2-OP from which a portion of the third electrode CL4p2 is removed is formed in the third electrode CL4p2, and the first electrode CL3p2 is exposed through the opening CL4p2-OP.

Figure 13:
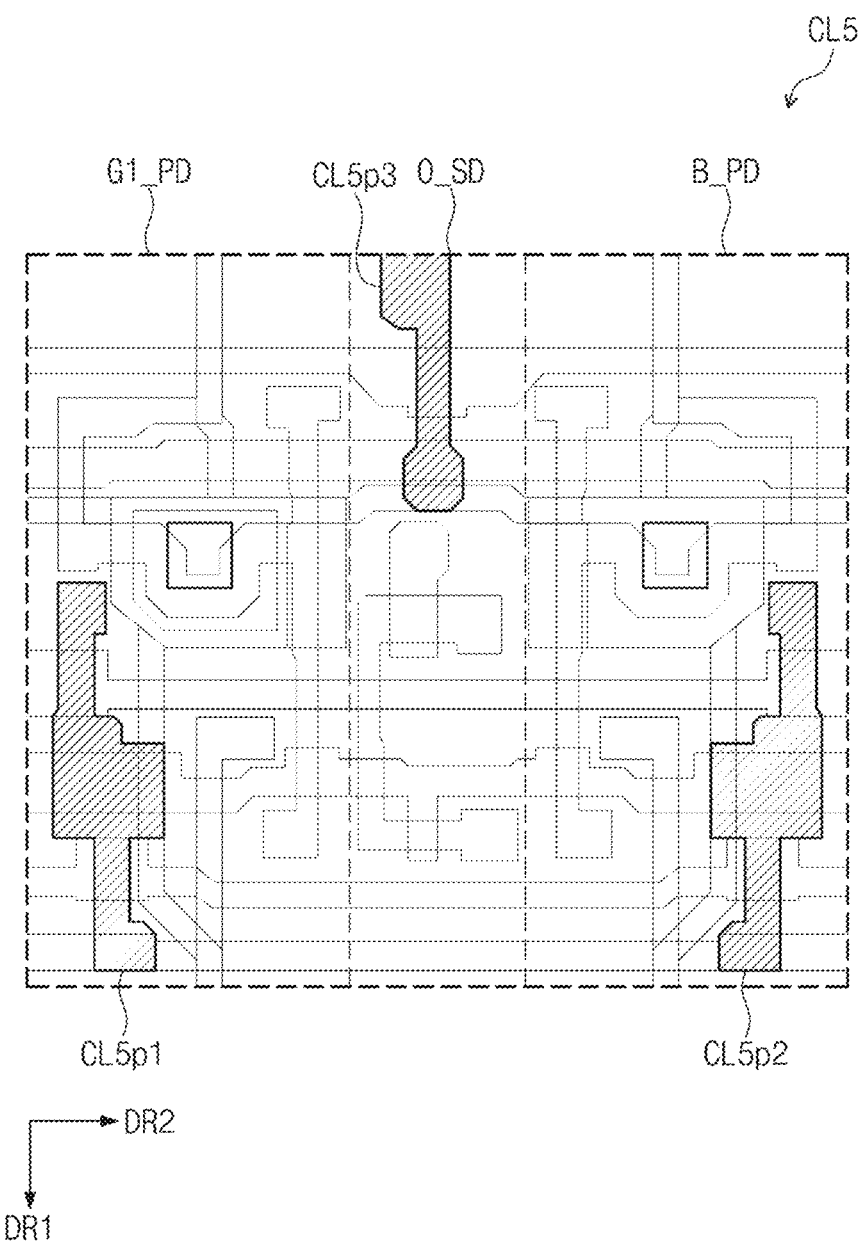
FIG. 13 is a plan view of one layer of a pixel driving circuit and a sensor driving circuit according to an embodiment of the inventive concept.

FIG. 13 is a plan view of a layer CL5 of a pixel driving circuit and a sensor driving circuit according to an embodiment of the inventive concept. The hatched fifth layer CL5 is illustrated in FIG. 13.

Referring to FIGS. 6, 7 and 13, in an embodiment, the fifth layer CL5 is a second semiconductor layer disposed between the third insulating layer 30 and the fourth insulating layer 40. The fifth layer CL5 includes a fourth semiconductor portion CL5p1, a fifth semiconductor portion CL5p2, and a sixth semiconductor portion CL5p3. The fourth semiconductor portion CL5p1, the fifth semiconductor portion CL5p2, and the sixth semiconductor portion CL5p3 include an oxide semiconductor. The fifth layer CL5 does not overlap the second layer CL2 (see FIG. 10).

Figure 14:
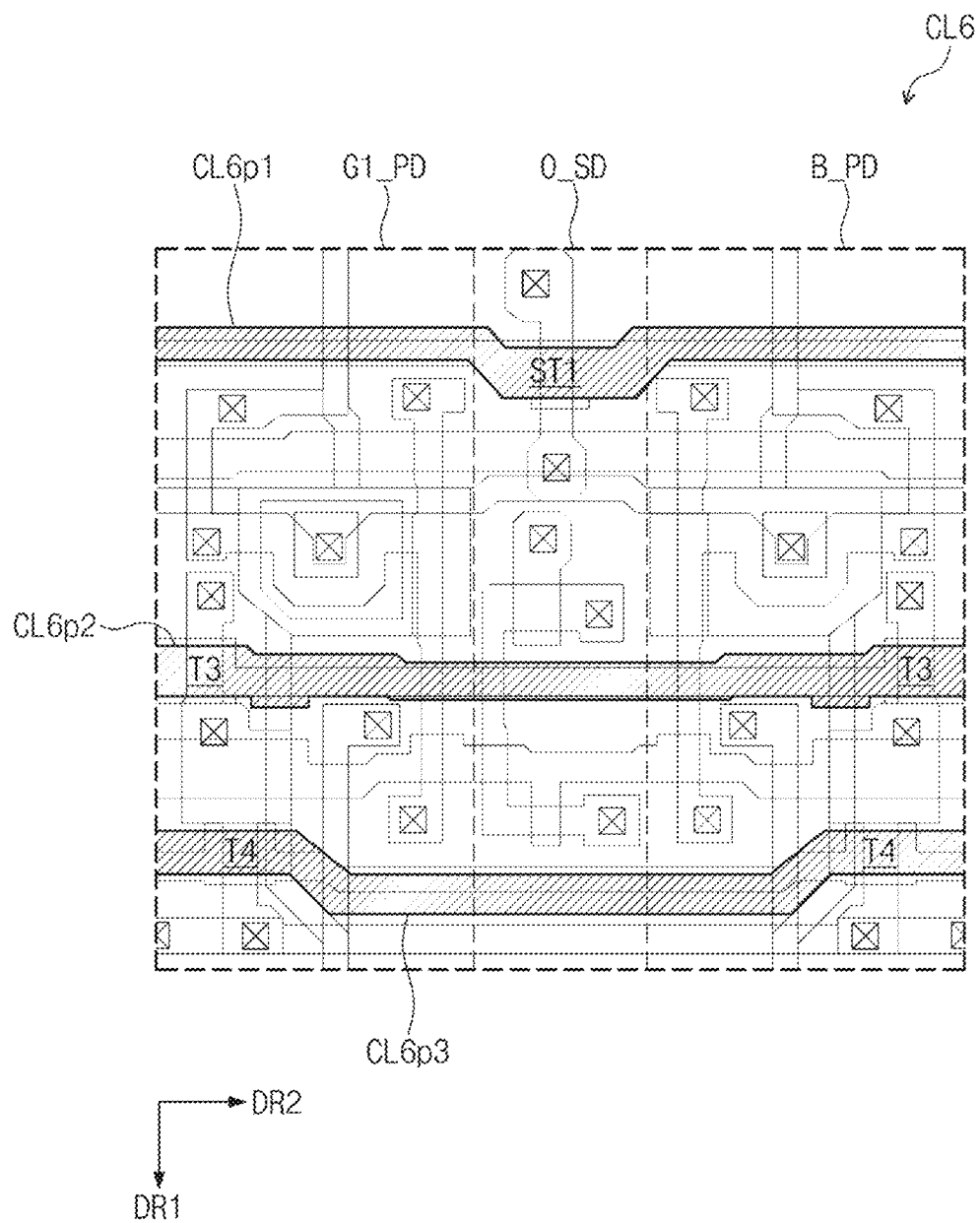
FIG. 14 is a plan view of one layer of a pixel driving circuit and a sensor driving circuit according to an embodiment of the inventive concept.

FIG. 14 is a plan view of a layer CL6 of a pixel driving circuit and a sensor driving circuit according to an embodiment of the inventive concept. The hatched sixth layer CL6 is illustrated in FIG. 14.

Referring to FIGS. 6, 7, and 14, in an embodiment, the sixth layer CL6 is a third conductive layer disposed between the fourth insulating layer 40 and the fifth insulating layer 50. The sixth layer CL6 includes a seventh line CL6p1, an eighth line CL6p2, and a ninth line CL6p3.

The seventh line CL6p1 extends in the second direction DR2. The seventh line CL6p1 corresponds to the reset control line RCL. The seventh line CL6p1 forms the reset transistor ST1 together with the sixth semiconductor portion CL5p3 shown in FIG. 13. For example, the reset control signal RST is provided through the seventh line CL6p1.

The eighth line CL6p2 extends in the second direction DR2. The eighth line CL6p2 corresponds to the compensation scan line SCLj. The eighth line CL6p2 forms the third transistor T3 together with the fourth semiconductor portion CL5p1 and the fifth semiconductor portion CL5p2 illustrated in FIG. 13. For example, the compensation scan signal SCj is provided through the eighth line CL6p2.

The ninth line CL6p3 extends in the second direction DR2. The ninth line CL6p3 corresponds to the initialization scan line SILj. The ninth line CL6p3 forms the fourth transistor T4 together with the fourth semiconductor portion CL5p1 and the fifth semiconductor portion CL5p2 illustrated in FIG. 13. For example, the initialization scan signal SIj is provided through the ninth line CL6p3.

Figure 15:
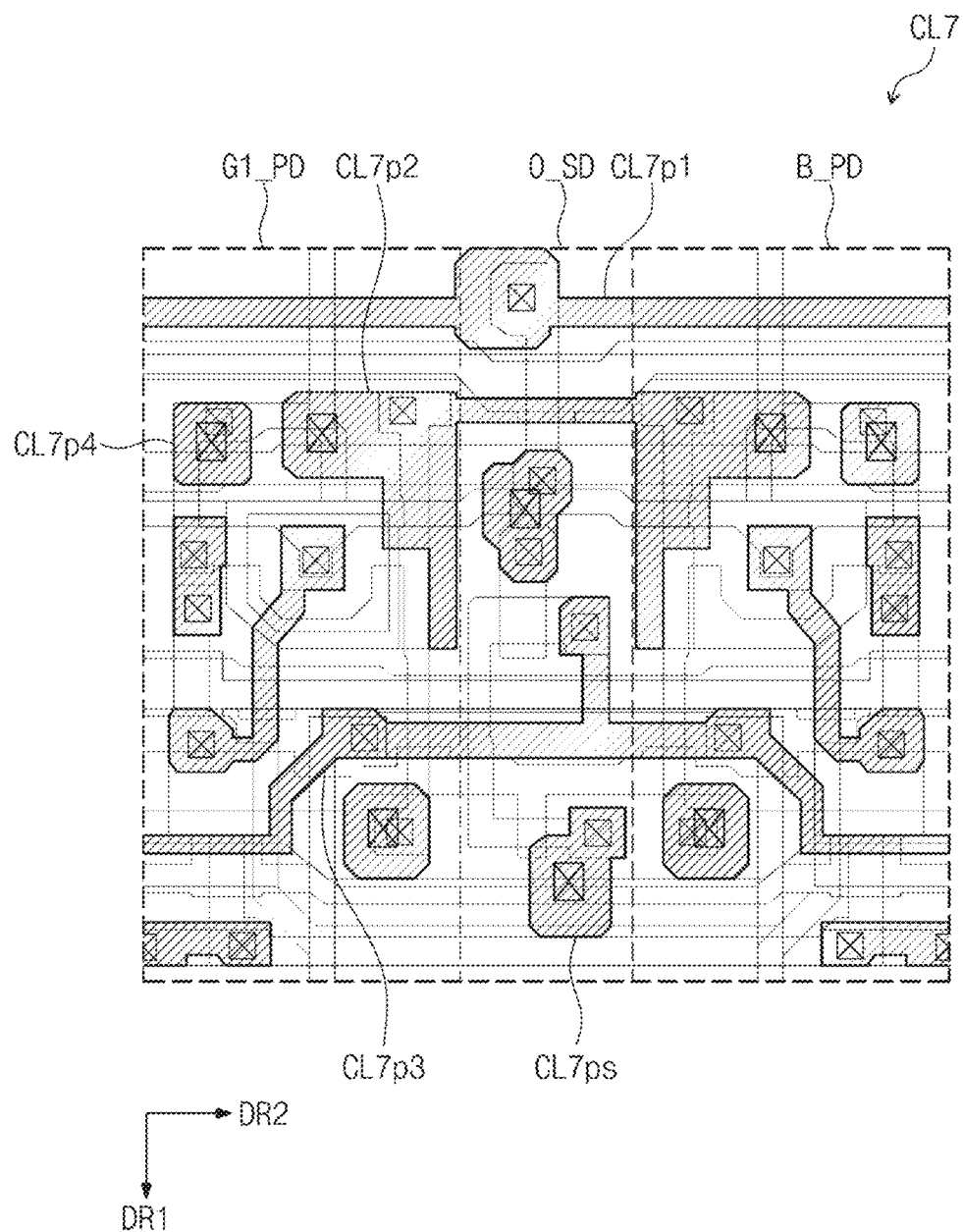
FIG. 15 is a plan view of one layer of a pixel driving circuit and a sensor driving circuit according to an embodiment of the inventive concept.

FIG. 15 is a plan view of a layer CL7 of a pixel driving circuit and a sensor driving circuit according to an embodiment of the inventive concept. The hatched seventh layer CL7 is illustrated in FIG. 15.

Referring to FIGS. 6, 7 and 15, in an embodiment, the seventh layer CL7 is a fourth conductive layer disposed between the fifth insulating layer 50 and the sixth insulating layer 60. The seventh layer CL7 includes a tenth line CL7p1, a power pattern CL7p2, an eleventh line CL7p3, a connection electrode CL7p4, and connection patterns CL7ps.

The tenth line CL7p1 extends in the second direction DR2 and corresponds to the third initialization voltage line VL5. The tenth line CL7p1 receives the reset voltage Vrst. The power pattern CL7p2 is provided with the first driving voltage ELVDD. The eleventh line CL7p3 corresponds to the second initialization voltage line VL4. The eleventh line CL7p3 receives the second initialization voltage VINT2. The connection patterns CL7ps is electrically connected to a pattern or line disposed on another layer. For example, the connection patterns CL7ps is electrically connected to another pattern or line that penetrates the insulating layer, or is electrically connected to another pattern or line that penetrates the insulating layer. For example, the connection electrode CL7p4 is the first connection electrode CNE10.

Figure 16A:
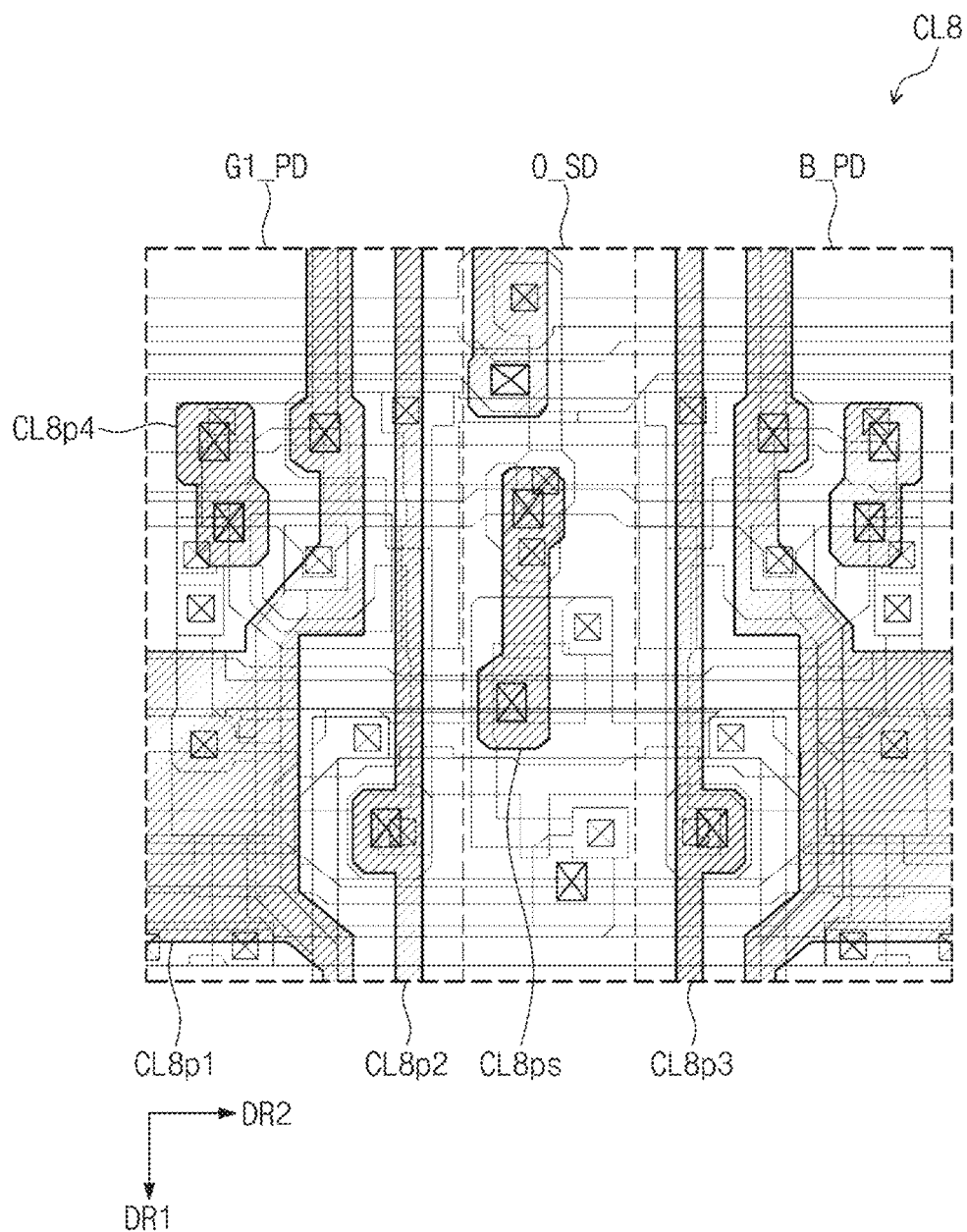
FIG. 16A is a plan view of one layer of a pixel driving circuit and a sensor driving circuit according to an embodiment of the inventive concept.

FIG. 16A is a plan view of a layer CL8 of a pixel driving circuit and a sensor driving circuit according to an embodiment of the inventive concept. The hatched eighth layer CL8 is illustrated in FIG. 16A.

Referring to FIGS. 5, 6, 7, and 16A, in an embodiment, the eighth layer CL8 is a fifth conductive layer disposed between the sixth insulating layer 60 and the seventh insulating layer 70. The eighth layer CL8 includes a twelfth line CL8p1, a thirteenth line CL8p2, a fourteenth line CL8p3, a connection electrode CL8p4, and connection patterns CL8ps.

The twelfth line CL8p1 extends in the first direction DR1 and corresponds to the first driving voltage line VL1 that receives the first driving voltage ELVDD. The thirteenth line CL8p2 extends in the first direction DR1 and corresponds to the first data line DL-G shown in FIG. 5. The fourteenth line CL8p3 extends in the first direction DR1 and corresponds to the second data line DL-RB shown in FIG. 5. Analog voltages that correspond to grayscale values are provided to the thirteenth line CL8p2 and the fourteenth line CL8p3.

Each of the connection patterns CL8ps is electrically connected to a pattern or line disposed on another layer. For example, the connection patterns CL7ps are electrically connected to another pattern or line that penetrates the insulating layer. For example, the connection electrode CL8p4 is the second connection electrode CNE20.

Figure 16B:
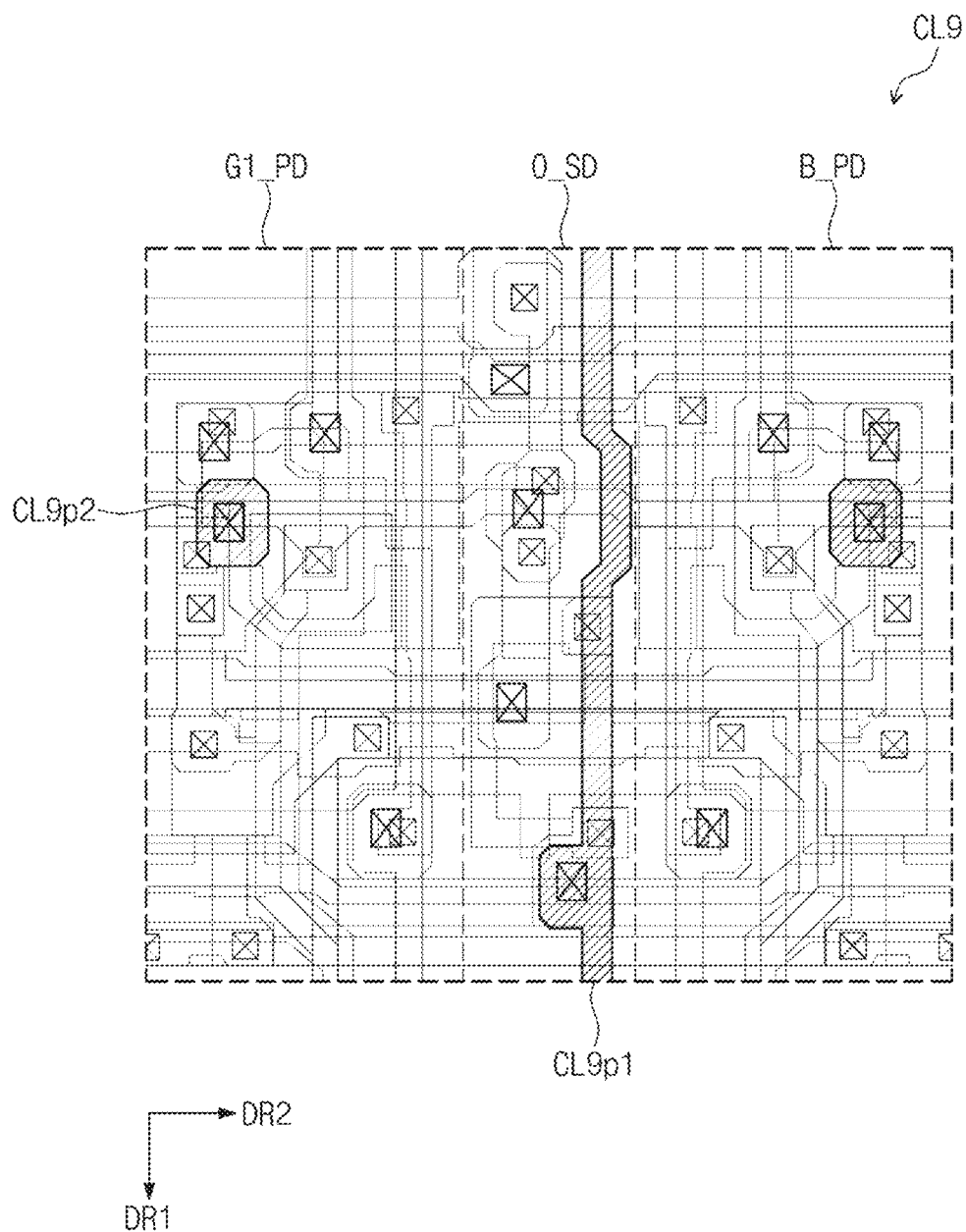
FIG. 16B is a plan view of one layer of a pixel driving circuit and a sensor driving circuit according to an embodiment of the inventive concept.

FIG. 16B is a plan view of a layer CL9 of a pixel driving circuit and a sensor driving circuit according to an embodiment of the inventive concept. The hatched ninth layer CL9 is illustrated in FIG. 16B.

Referring to FIGS. 5, 6, 7, 16A, and 16B, in an embodiment, the ninth layer CL9 is a sixth conductive layer disposed between the seventh insulating layer 70 and the eighth insulating layer 80. The ninth layer CL9 includes a fifteenth line CL9p1 and a connection electrode CL9p2.

The fifteenth line CL9p1 extends in the first direction DR1 and corresponds to the readout line RL shown in FIG. 5. For example, the detection signal is provided through the fifteenth line CL9p1. When viewed in a plan view, for example, when viewing a plane parallel to the first direction DR1 and the second direction DR2, the fifteenth line CL9p1 disposed between the thirteenth line CL8p2 and the fourteenth line CL8p3 is disposed on a different layer from the thirteenth line CL8p2 and the fourteenth line CL8p3. For example, the first data line DL-G and the second data line DL-RB are disposed on the same layer, and the readout line RL disposed between the first data line DL-G and the second data line DL-RB is disposed on a different layer from the first data line DL-G and the second data line DL-RB.

A seventh insulating layer 70 is disposed between the layer on which the first data line DL-G and the second data line DL-RB are disposed and the layer on which the readout line RL is disposed, and the seventh insulating layer 70 is an organic layer. Accordingly, the readout line RL is disposed on a different layer from the relatively adjacent second data line DL-RB. For example, the readout line RL is spaced apart from the second data line DL-RB in a vertical direction as well as in a horizontal direction.

According to an embodiment of the inventive concept, a phenomenon in which the readout line RL is coupled to an adjacent data line, such as the second data line DL-RB, is reduced or eliminated. Accordingly, noise generated in the detection signal provided to the readout line RL by the voltage applied to the second data lines DL-RB is reduced. As a result, fingerprint sensing sensitivity and fingerprint sensing accuracy are increased.

To arrange the readout line RL on another layer, as the eighth insulating layer 80 and the ninth layer CL9 are additionally provided, a connection electrode CL9p2 is further added. The connection electrode CL9p2 is the third connection electrode CNE30.

Figure 17A:
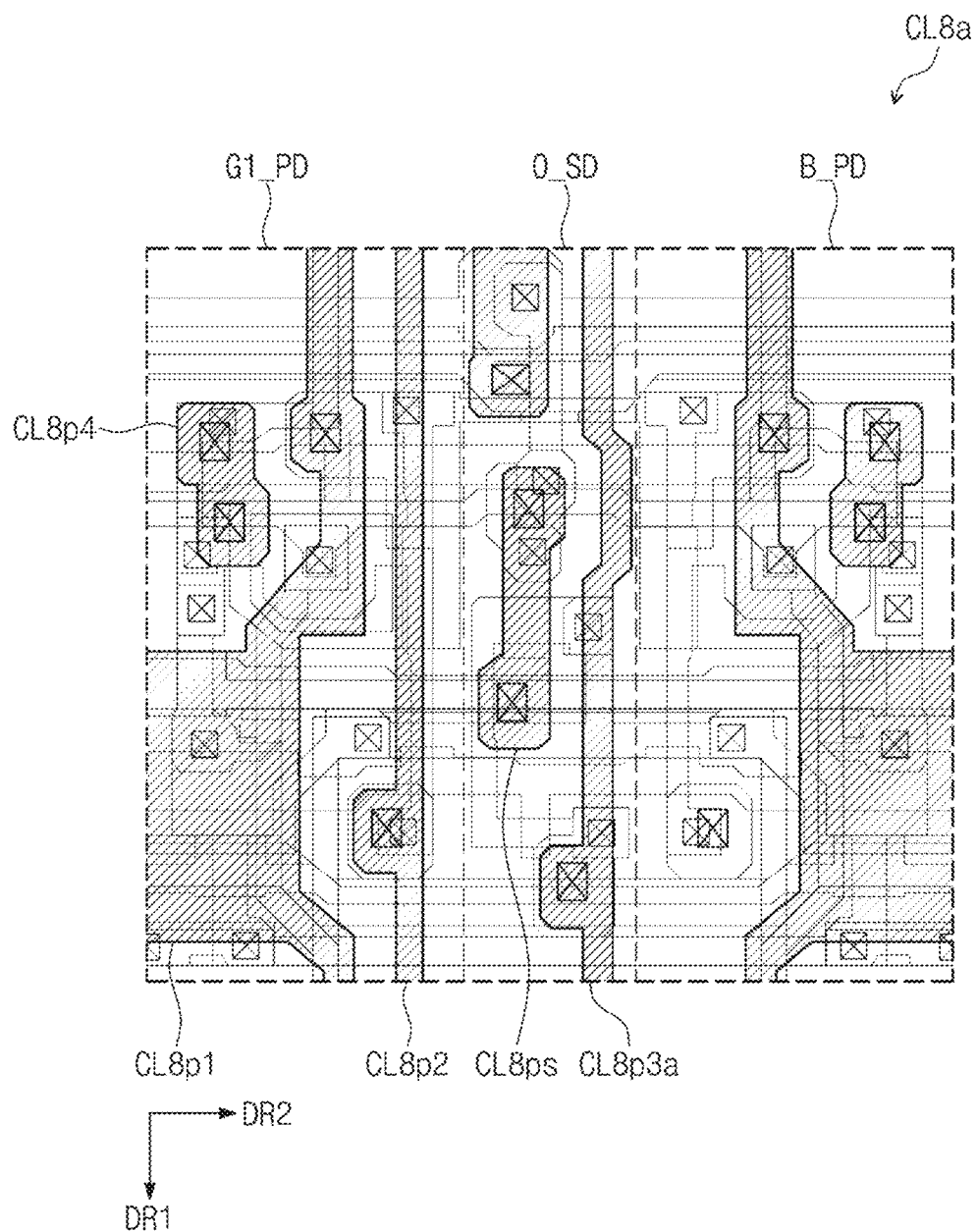
FIG. 17A is a plan view of one layer of a pixel driving circuit and a sensor driving circuit according to an embodiment of the inventive concept.

FIG. 17A is a plan view of a layer CL8a of a pixel driving circuit and a sensor driving circuit according to an embodiment of the inventive concept. The hatched eighth layer CL8a is illustrated in FIG. 17A.

Referring to FIGS. 5, 6, 7, and 17A, in an embodiment, the eighth layer CL8a is a fifth conductive layer disposed between the sixth insulating layer 60 and the seventh insulating layer 70. The eighth layer CL8a includes a twelfth line CL8p1, a thirteenth line CL8p2, a fourteenth line CL8p3a, a connection electrode CL8p4, and connection patterns CL8ps.

The thirteenth line CL8p2 extends in the first direction DR1 and corresponds to the first data line DL-G shown in FIG. 5. The fourteenth line CL8p3a extends in the first direction DR1 and corresponds to the readout line RL shown in FIG. 5. Analog voltages that correspond to grayscale values are provided to the thirteenth line CL8p2, and a detection signal is provided to the fourteenth line CL8p3.

Figure 17B:
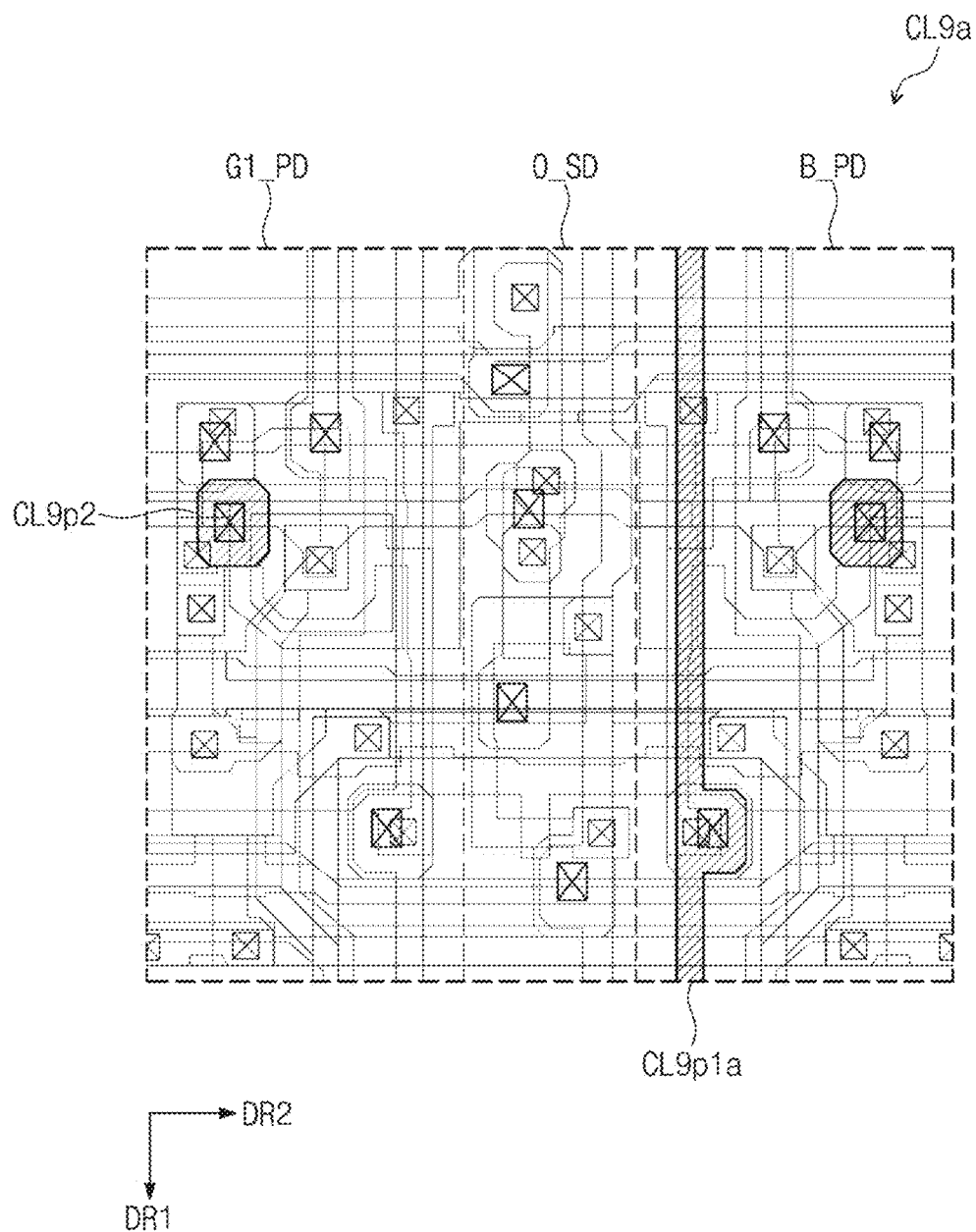
FIG. 17B is a plan view of one layer of a pixel driving circuit and a sensor driving circuit according to an embodiment of the inventive concept.

FIG. 17B is a plan view of a layer CL9a of a pixel driving circuit and a sensor driving circuit according to an embodiment of the inventive concept. The hatched ninth layer CL9a is illustrated in FIG. 17B.

Referring to FIGS. 5, 6, 7, 17A, and 17B, in an embodiment, the ninth layer CL9a is a sixth conductive layer disposed between the seventh insulating layer 70 and the eighth insulating layer 80. The ninth layer CL9a includes a fifteenth line CL9p1a and a connection electrode CL9p2.

The fifteenth line CL9p1a extends in the first direction and corresponds to the second data line DL-RB shown in FIG. 5. Analog voltages that correspond to grayscale values are provided through the fifteenth line CL9p1a.

When viewed in a plan view, the fourteenth line CL8p3 disposed between the thirteenth line CL8p2 and the fifteenth line CL9p1a is disposed on a different layer from at least one of the thirteenth line CL8p2 and the fifteenth line CL9p1a. For example, the first data line DL-G and the readout line RL are disposed on the same layer, and the second data line DL-RB is disposed on a different layer from the first data line DL-G and the readout line RL. A phenomenon in which the readout line RL is coupled to an adjacent data line, such as the second data line DL-RB, is reduced or eliminated.

Figure 18:
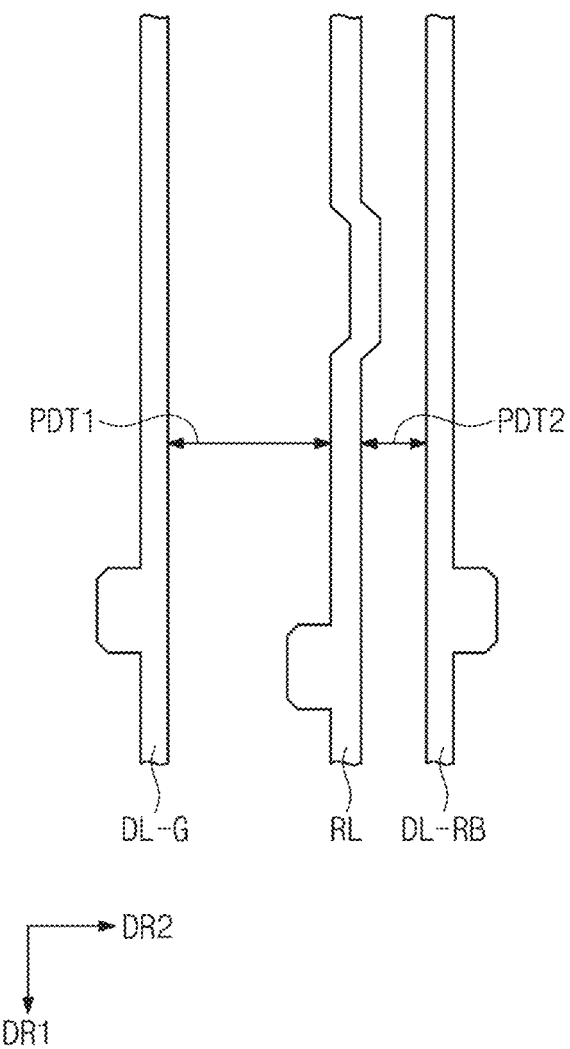
FIG. 18 is a plan view of a configuration of a display panel according to an embodiment.

FIG. 18 is a plan view of a partial configuration of a display panel according to an embodiment of the inventive concept.

Referring to FIG. 18, in an embodiment, a first data line DL-G, a second data line DL-RB, and a readout line RL are illustrated. A first distance PDT1 between the first data line DL-G and the readout line RL is greater than a second distance PDT2 between the readout line RL and the second data line DL-RB.

The readout line RL is disposed on a different layer from the relatively adjacent second data line DL-RB. For example, the readout line RL is spaced apart from the second data line DL-RB in a vertical direction as well as in a horizontal direction. Accordingly, a phenomenon in which the readout line RL is coupled to adjacent data lines is reduced. As a result, noise generated in a detection signal provided to the readout line RL is reduced, and fingerprint sensing sensitivity and fingerprint sensing accuracy are increased.

Figure 19:
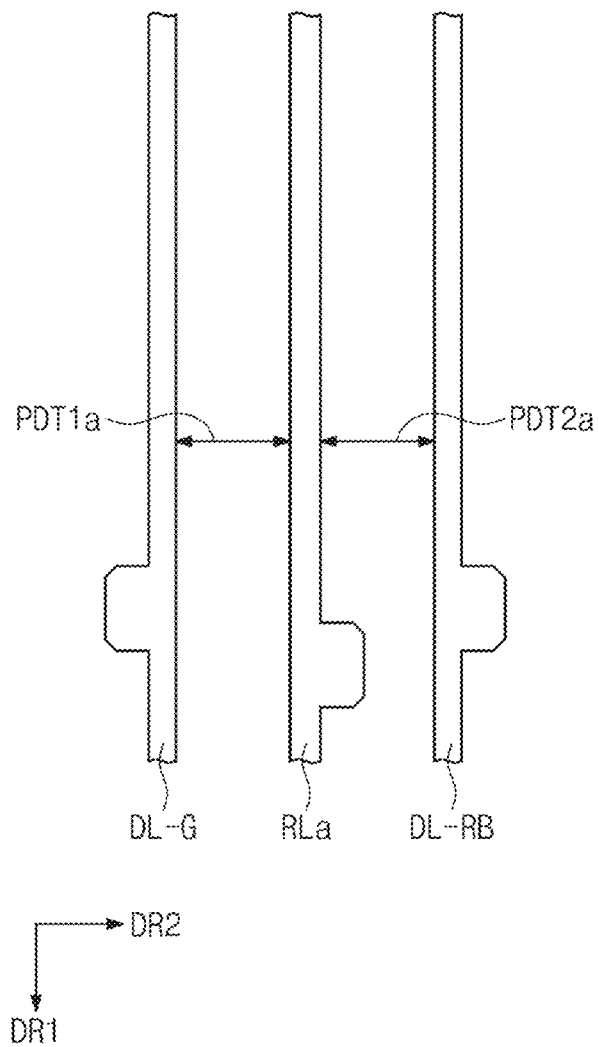
FIG. 19 is a plan view of a configuration of a display panel according to an embodiment.

FIG. 19 is a plan view of a partial configuration of a display panel according to an embodiment of the inventive concept.

Referring to FIG. 19, in an embodiment, a first data line DL-G, a second data line DL-RB, and a readout line RLa are illustrated.

Disposing the readout line RLa on a different layer from the first data line DL-G and the second data line DL-RB increases a degree of freedom in designing a position of the readout line RLa. When viewed in a plan view, the position of the readout line RLa can be adjusted such that the first distance PDT1a between the first data line DL-G and the readout line RLa is substantially equal to the second distance PDT2a between the readout line RLa and the second data line DL-RB. Accordingly, coupling between the readout line RLa and adjacent data lines, such as the first data line DL-G and the second data line DL-RB, is reduced.

According to the above, when viewed in a plan view, a readout line disposed between the two data lines is disposed on a different layer from at least one of the two data lines. For example, a phenomenon in which a readout line is coupled with an adjacent data line is reduced or eliminated. Accordingly, noise generated in the detection signal provided to the readout line by the voltage applied to the data line is reduced. As a result, fingerprint sensing sensitivity and fingerprint sensing accuracy are increased.

Although embodiments of the inventive concept have been described, it is understood that embodiments of the inventive concept should not be limited to embodiments but that various changes and modifications may be made by one ordinary skilled in the art within the spirit and scope of embodiments of the inventive concept as hereinafter claimed.

What is claimed is:

1. A display device, comprising:
a first pixel that includes a first pixel driving circuit and a first light emitting element;
a second pixel that includes a second pixel driving circuit and a second light emitting element;
a sensor that includes a sensor driving circuit and a light detection element;
a first data line that extends in a first direction and is electrically connected to the first pixel;
a second data line that extends in the first direction and is electrically connected to the second pixel; and
a readout line that extends in the first direction and is electrically connected to the sensor,
wherein the readout line is disposed on a different layer from at least one of the first data line and the second data line.

2. The display device of claim 1, wherein the first pixel driving circuit, the sensor driving circuit, and the second pixel driving circuit are arranged in a second direction that crosses the first direction.

3. The display device of claim 1, wherein the first data line and the second data line are disposed on a same layer, and the readout line is disposed on a different layer from the first data line and the second data line.

4. The display device of claim 1, wherein the first data line and the readout line are disposed on a same layer, and the second data line is disposed on a different layer from the first data line and the readout line.

5. The display device of claim 1, wherein, when viewed in a plan view, the readout line is disposed between the first data line and the second data line.

6. The display device of claim 1, wherein, when viewed in a plan view, a distance between the first data line and the readout line is greater than a distance between the second data line and the readout line.

7. The display device of claim 1, wherein, when viewed in a plan view, a distance between the first data line and the readout line is equal to a distance between the second data line and the readout line.

8. The display device of claim 1, further comprising an organic layer disposed between the second data line and the readout line.

9. The display device of claim 1, wherein the first pixel is a green pixel, and the second pixel is a blue pixel or a red pixel.

10. The display device of claim 1, wherein the sensor driving circuit comprises:
a reset transistor that includes a first electrode that receives a reset voltage, a second electrode connected to a first sensing node, and a third electrode that receives a reset control signal;
an amplification transistor that includes a first electrode that receives a sensing driving voltage, a second electrode connected to a second sensing node, and a third electrode connected to the first sensing node; and
an output transistor that includes a first electrode connected to the second sensing node, a second electrode connected to the readout line, and a third electrode that receives an output control signal.

11. The display device of claim 10, wherein the reset transistor is an oxide semiconductor transistor.

12. The display device of claim 1, wherein the first pixel driving circuit comprises:
a first transistor connected between a first driving voltage line that receives a first driving voltage and the first light emitting element;
a second transistor connected between the first data line and a first electrode of the first transistor;
a third transistor connected between a second electrode of the first transistor and a first node and that receives a first scan signal;
a fourth transistor connected between a first initialization voltage line that receives first initialization voltage and the first node and that receives a second scan signal; and
a fifth transistor connected between a second initialization voltage line that receives second initialization voltage and an anode of the first light emitting element and that receives a third scan signal.

13. The display device of claim 12, wherein each of the third transistor and the fourth transistor is an oxide semiconductor transistor.

14. The display device of claim 1, further comprising a plurality of scan lines that extend in a second direction that intersects the first direction,
wherein the plurality of scan lines comprise an initialization scan line, a compensation scan line, a write scan line, and a black scan line that are connected to the first pixel and the second pixel.

15. An electronic device comprising a display device, comprising:
a base layer; and
a pixel layer disposed on the base layer, wherein the pixel layer includes a plurality of pixels, a plurality of sensors, a plurality of scan lines electrically connected to the plurality of pixels, a plurality of data lines electrically connected to the plurality of pixels, and a plurality of readout lines electrically connected to the plurality of sensors,
wherein the plurality of readout lines are disposed on a different layer than at least some of the plurality of data lines.

16. The electronic device of claim 15, wherein the plurality of readout lines comprise a readout line, and the plurality of data lines comprise a first data line and a second data line,
wherein, when viewed in a plan view, the readout line is disposed between the first data line and the second data line, and
wherein, when viewed in a plan view, a distance between the first data line and the readout line is greater than or equal to a distance between the second data line and the readout line.

17. The electronic device of claim 16, wherein the first data line and the second data line are disposed on a same layer, and the readout line is disposed on a different layer from the first data line and the second data line.

18. The electronic device of claim 16, wherein the first data line and the readout line are disposed on a same layer, and the second data line is disposed on a different layer from the first data line and the readout line.

19. The electronic device of claim 16, further comprising an organic layer disposed between the second data line and the readout line.

20. The electronic device of claim 16,
wherein the plurality of pixels comprise a plurality of green pixels, a plurality of red pixels, and a plurality of blue pixels, and
wherein the plurality of green pixels are connected to the first data line, and the plurality of red pixels and the plurality of blue pixels are connected to the second data line.

* * * * *